(12) United States Patent
Huang et al.

(10) Patent No.: US 12,342,681 B2
(45) Date of Patent: Jun. 24, 2025

(54) ALL-OXIDE TRANSISTOR STRUCTURE, METHOD FOR FABRICATING THE SAME AND DISPLAY PANEL COMPRISING THE STRUCTURE

(71) Applicant: INDUSTRIAL TECHNOLOGY RESEARCH INSTITUTE, Hsinchu (TW)

(72) Inventors: Haw-Tyng Huang, Taipei (TW); Po-Chun Yeh, Taichung (TW); Hsien-Yi Liao, Taichung (TW); Yao-Cing Han, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 18/397,244

(22) Filed: Dec. 27, 2023

(65) Prior Publication Data

US 2025/0098414 A1    Mar. 20, 2025

Related U.S. Application Data

(60) Provisional application No. 63/538,534, filed on Sep. 15, 2023.

(51) Int. Cl.
*H10K 59/121* (2023.01)
*G09G 3/3233* (2016.01)
(Continued)

(52) U.S. Cl.
CPC ....... *H10K 59/1213* (2023.02); *G09G 3/3233* (2013.01); *H10K 59/1201* (2023.02);
(Continued)

(58) Field of Classification Search
CPC ........... H10K 59/1213; H10K 59/1201; H10K 59/124; G09G 3/3233; G09G 2300/0408;
(Continued)

(56) References Cited

U.S. PATENT DOCUMENTS

| 7,638,374 B2 | 12/2009 | Wang et al. |
| 9,331,090 B2 | 6/2016 | Alsmeier et al. |

(Continued)

FOREIGN PATENT DOCUMENTS

| CN | 102130175 A | 7/2011 |
| TW | 202201773 A | 1/2022 |

(Continued)

OTHER PUBLICATIONS

Huang et al., "Vertical channel metal-oxide clusters as sensitive N02 sensor with modulated response at room temperature", Sensors and Actuators: B. Chemical, vol. 354, No. 131222, 2022, pp. 1-10.

(Continued)

*Primary Examiner* — Douglas Wilson
(74) *Attorney, Agent, or Firm* — Birch, Stewart, Kolasch & Birch, LLP

(57) ABSTRACT

An all-oxide transistor structure includes a substrate having an upper surface and a first transistor disposed on the upper surface of the substrate. The first transistor includes a first drain, a first dielectric layer, a first source, at least one first opening and a first channel layer. The first drain, the first dielectric layer and the first source are disposed on the substrate along a first direction, and the first direction is parallel to a normal direction of the upper surface. The first opening passes through the first drain, the first dielectric layer and the first source along the first direction. The first channel layer, the first gate dielectric layer and the first gate are disposed in the first opening. The first gate dielectric (Continued)

layer is disposed on the first channel layer. The first gate is disposed on the first gate dielectric layer.

18 Claims, 26 Drawing Sheets

(51) Int. Cl.
| | |
|---|---|
| *H10D 30/01* | (2025.01) |
| *H10D 30/63* | (2025.01) |
| *H10D 30/67* | (2025.01) |
| *H10D 62/17* | (2025.01) |
| *H10D 84/01* | (2025.01) |
| *H10D 86/40* | (2025.01) |
| *H10D 86/60* | (2025.01) |
| *H10K 59/12* | (2023.01) |
| *H10K 59/124* | (2023.01) |
| *H10D 30/60* | (2025.01) |

(52) U.S. Cl.
CPC ......... *H10K 59/124* (2023.02); *H10D 30/025* (2025.01); *H10D 30/60* (2025.01); *H10D 30/63* (2025.01); *H10D 30/6735* (2025.01); *H10D 30/6755* (2025.01); *H10D 62/292* (2025.01); *H10D 84/016* (2025.01); *H10D 84/0195* (2025.01); *H10D 86/423* (2025.01); *H10D 86/60* (2025.01)

(58) Field of Classification Search
CPC ........ G09G 2300/0842; H01L 27/1225; H01L 29/7869; H01L 29/66666; H01L 29/7828; H01L 29/78642; H01L 21/823885; H01L 21/823487; H01L 21/28; H01L 21/28008; H01L 29/08; H01L 29/0847; H01L 29/1037; H01L 29/66477; H01L 29/78; H01L 29/7827; H10B 12/053; H10D 30/021; H10D 30/025; H10D 30/60; H10D 30/63; H10D 30/6735; H10D 30/6755; H10D 62/151; H10D 62/292; H10D 84/016; H10D 84/0195; H10D 84/038; H10D 86/423; H10D 86/60
See application file for complete search history.

(56) References Cited

U.S. PATENT DOCUMENTS

| | | | |
|---|---|---|---|
| 10,573,746 | B2 | 2/2020 | Jagannathan et al. |
| 2015/0055051 | A1 | 2/2015 | Osawa et al. |
| 2016/0307987 | A1* | 10/2016 | Rankov .............. H10D 30/6728 |
| 2017/0148517 | A1 | 5/2017 | Harari |
| 2020/0006572 | A1 | 1/2020 | Sharma et al. |
| 2020/0227429 | A1 | 7/2020 | Ji et al. |
| 2020/0227525 | A1 | 7/2020 | Ji et al. |
| 2021/0376157 | A1 | 12/2021 | Doornbos et al. |
| 2023/0178441 | A1 | 6/2023 | Ye et al. |
| 2023/0215856 | A1 | 7/2023 | Kim et al. |
| 2023/0261033 | A1 | 8/2023 | Chae et al. |

FOREIGN PATENT DOCUMENTS

| | | | |
|---|---|---|---|
| TW | 202224178 A | 6/2022 | |
| WO | WO-2023173914 A1 * | 9/2023 | ............. H01L 29/45 |
| WO | WO-2023236358 A1 * | 12/2023 | |
| WO | WO-2023236376 A1 * | 12/2023 | |
| WO | WO-2024095113 A1 * | 5/2024 | |

OTHER PUBLICATIONS

Jagannathan et al., "Vertical-Transport Nanosheet Technology for CMOS Scaling beyond Lateral-Transport Devices", 2021 IEEE International Electron Devices Meeting (IEDM), San Francisco, CA, USA, 2021, pp. 26.1.1-26.1.4.

Lin et al., "Nanometer-Thick Oxide Semiconductor Transistor with Ultra-High Drain Current", ACS Nano, vol. 16, No. 12, 2022, pp. 21536-21545.

Yakimets et al., "Vertical GAAFETs for the Ultimate CMOS Scaling", IEEE Transactions on Electron Devices, vol. 62, No. 5, May 2015, pp. 1433-1439.

Zhang et al., "Strategies for Applications of Oxide-Based Thin Film Transistors", Electronics, vol. 11, No. 960, 2022, pp. 1-31.

Taiwanese Office Action and Search Report for Taiwanese Application No. 112151045, dated Sep. 20, 2024.

* cited by examiner

ALL-OXIDE TRANSISTOR STRUCTURE, METHOD FOR FABRICATING THE SAME AND DISPLAY PANEL COMPRISING THE STRUCTURE

This application claims the benefit of U.S. provisional application Ser. No. 63/538,534, filed Sep. 15, 2023, the disclosure of which is incorporated by reference herein in its entirety.

TECHNICAL FIELD

The disclosure relates to an all-oxide transistor structure, a method for fabricating the same and a display panel comprising the structure.

BACKGROUND

Recently, people's demand for display panels is gradually increasing, and the requirements for display quality are also getting higher and higher. In particular, in order to provide high-resolution image quality, miniaturization of pixels and light-emitting components (such as micro-organic-light-emitting diodes (micro-OLED), micro-light-emitting diodes (micro-LED) or others) has become the mainstream of today's display panels. However, with the miniaturization of pixels, the transistors used to control the switch of the pixel must also be miniaturized, causing the miniaturized transistors to face the problem of insufficient current supply.

SUMMARY

According to one embodiment, an all-oxide transistor structure is provided. The all-oxide transistor structure includes a substrate and a first transistor. The substrate has an upper surface. The first transistor is disposed on the upper surface of the substrate. The first transistor includes a first drain, a first dielectric layer, a first source, at least one first opening and a first channel layer. The first drain, the first dielectric layer and the first source are disposed on the substrate along a first direction, and the first direction is parallel to a normal direction of the upper surface. The first opening passes through the first drain, the first dielectric layer and the first source along the first direction. A first channel layer, a first gate dielectric layer and a first gate are disposed in the first opening. The first opening is disposed on the first drain, the first dielectric layer and the first source. The first opening is a columnar opening. The first channel layer of the first transistor is disposed on a hole wall of the first opening, the first gate dielectric layer is disposed on a hole wall of the first channel layer, and the first gate is disposed in an opening on the first gate dielectric layer.

According to another embodiment, a method for fabricating an all-oxide transistor structure is provided. The method includes providing a substrate having an upper surface; and fabricating a first transistor disposed on the upper surface of the substrate. The first transistor includes a first drain, a first dielectric layer, a first source, at least one first opening and a first channel layer. The first drain, the first dielectric layer and the first source are disposed on the substrate along a first direction, and the first direction is parallel to a normal direction of the upper surface. The first opening passes through the first drain, the first dielectric layer and the first source along the first direction. A first channel layer, a first gate dielectric layer and a first gate are deposited in the first opening. The first gate dielectric layer is deposited on the first channel layer, and the first gate is deposited on the first gate dielectric layer. The deposition of the first channel layer and the deposition of the first gate dielectric layer are performed by an atomic layer deposition, respectively.

According to a further embodiment, a display panel is provided. The display panel includes a substrate, an array of pixels disposed on the substrate and a driving circuit disposed on the substrate. The array of pixels and the driving circuit comprise the all-oxide transistor structure described above.

Figure 1:
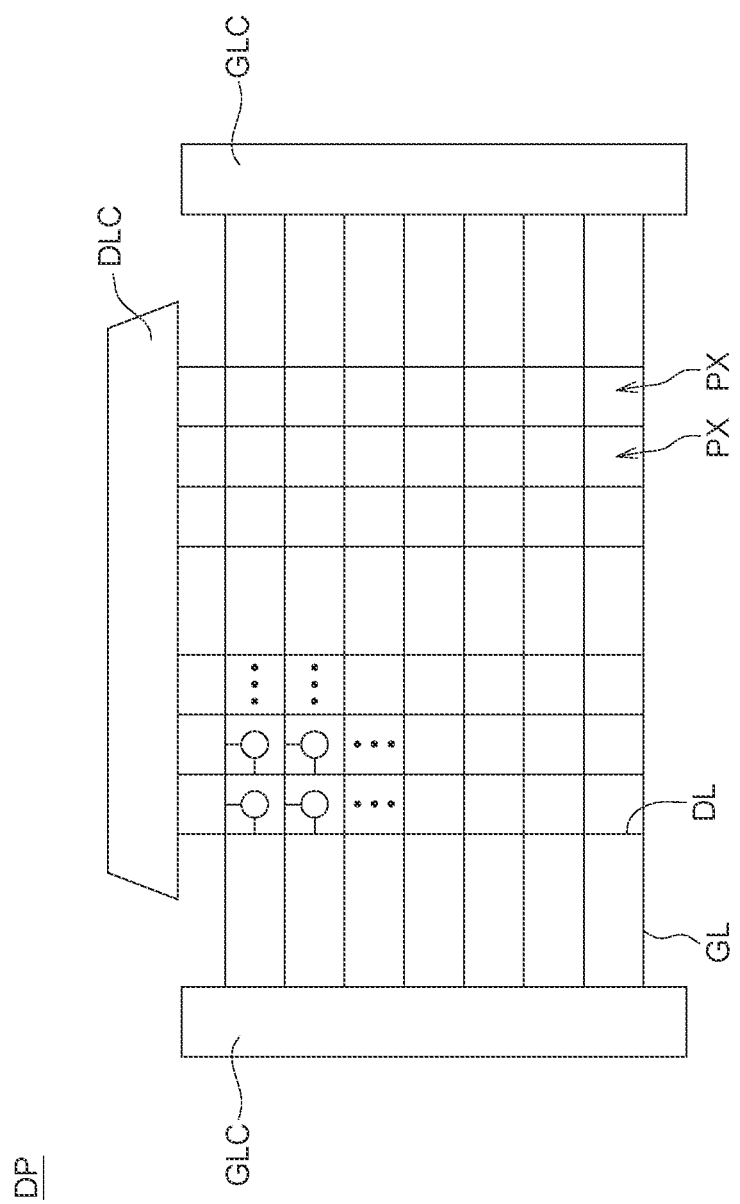
FIG. 1 shows a display panel according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2A:
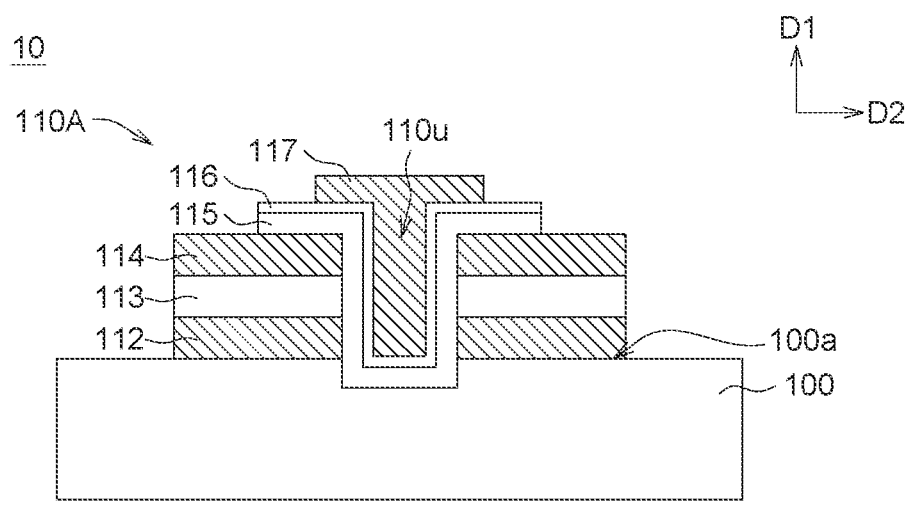
FIG. 2A shows a cross-sectional view of an all-oxide transistor structure according to an embodiment of the present disclosure.
Figure 2B:
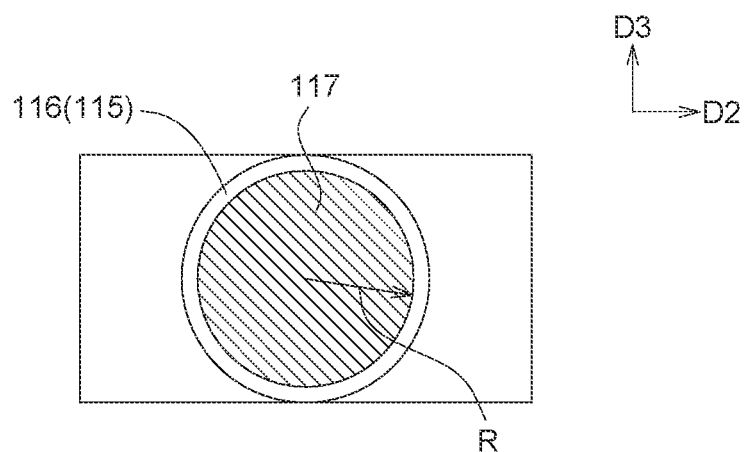
FIG. 2B shows a partial top view of the all-oxide transistor structure of FIG. 2A.

Referring to FIG. 1, it shows a display panel DP according to an embodiment of the disclosure. The display panel DP includes a substrate 100, an array of pixels PX and a driving circuit. The array of pixels PX and the driving circuit are disposed on the substrate 100. The driving circuit includes a plurality of data lines DL, a plurality of gate lines GL, a circuit DLC connected to the data lines DL and a circuit GLC connected to the gate lines GL. Further, extension directions of data lines DL and extension directions of gate lines are intersected with each other, and the array of pixels PX on the substrate 100 is formed. Each of data lines DL, for example, extends along a row direction (for example, a vertical direction) and is connected to the pixels PX of the respective row. Each of gate lines GL, for example, extends along a column direction (for example, a horizontal direction) and is connected to the pixels PX of the respective column. The array of pixels and the driving circuit comprise an all-oxide transistor structure used to control the switching of light-emitting elements. According to an embodiment, each pixel PX in the array of pixels PX can correspond to a 1T (1 transistor) structure, as shown in FIGS. 2A-2B. In an embodiment, each pixel PX in the array of pixels PX can correspond to a 2T1C (2 transistors and 1 capacitor) driving circuit, as shown in FIGS. 3, 4A-4B and 5A-5B, but the present disclosure is not limited thereto. In the present disclosure, all transistors in the pixels PX are all-oxide transistors. The oxide is, for example, semiconducting oxide. This kind of structure is also called all-oxide-semiconductor transistor structure.

In one embodiment, each pixel PX may correspond to a light-emitting element (the present disclosure is not limited thereto). The light-emitting element is, for example, a micro-light-emitting diode (micro-LED), a micro-organic light-emitting diode (micro-OLED), or other suitable light-emitting element. As the demand for miniaturization increases, the pixel PX and the transistors therein must also be miniaturized. However, when the transistors are miniaturized, they may face the problem that the current is too small to supply the light emission of light-emitting elements. Therefore, the present disclosure provides a first transistor 110A which is three-dimensional and all-oxide, to supply larger current to the light-emitting element.

FIG. 2A shows a cross-sectional view of the all-oxide transistor structure 10 according to an embodiment of the present disclosure. FIG. 2B shows a partial top view of the all-oxide transistor structure 10 of FIG. 2A. FIG. 2A corresponds to, for example, the plane formed by the first direction D1 and the second direction D2. FIG. 2B, for example, corresponds to the plane formed by the second direction D2 and the third direction D3. The first direction D1, the second direction D2 and the third directions D3 may be perpendicular to each other, but the present disclosure is not limited thereto. Please refer to FIGS. 2A-2B at the same time. The all-oxide transistor structure 10 includes a substrate 100 and a first transistor 110A. The substrate 100 has an upper surface 100a. The first transistor 110A is disposed on the upper surface 100a of the substrate 100. The first transistor 110A includes a first drain 112, a first dielectric layer 113, a first source 114, at least one first opening 110u, a first channel layer 115, a first gate dielectric layer 116 and a first gate 117. The first drain 112, a first dielectric layer 113 and the first source 114 are disposed on the substrate 100 along the first direction D1, and the first direction D1 is parallel to a normal direction of the upper surface 100a. That is, the first drain 112 overlaps the first source 114 in the first direction D1. For example, the first source 114 is vertically stacked on the first drain 112 to form a three-dimensional all-oxide transistor structure. The first opening 110u is disposed on the first drain 112, the first dielectric layer 113 and the first source 114. The first opening 110u is a columnar opening. In the present embodiment, the columnar opening of the first opening 110u is a cylindrical opening, but the present disclosure is not limited thereto. In other embodiments, the columnar opening of the first opening 110u can be an elliptical columnar opening, a rectangular columnar opening or other geometric columnar openings. The first channel layer 115 will be deposited on a hole wall of the first opening 110u having a high aspect ratio by an atomic layer deposition, such as atomic layer physical vapor deposition (ALPVD) or atomic layer chemical vapor deposition (ALCVD). The first gate dielectric layer 116 can also be deposited on a hole wall of the first channel layer 115 having a high aspect ratio by an atomic layer deposition, such as ALPVD or ALCVD. The first gate 117 is disposed in an opening (hole) on the first gate dielectric layer 116, and the first gate 117 can be formed by a general deposition, but not the atomic layer deposition. A channel length (CL) of the first transistor 110A can be defined by a thickness of the first dielectric layer 113, and a channel width (CW) of the first transistor 110A can be defined by a circumference $2\pi R$ of round hole of the first opening 110u. Accordingly, the present disclosure utilizes a cylindrical tubular transistor structure to achieve a larger channel width-to-length ratio (CW/CL) to maintain the effect of high driving current while miniaturizing the transistor.

The first opening 110u passes through the first drain 112, the first dielectric layer 113 and the first source 114 along the first direction D1, and exposes the substrate 100. In the present embodiment, the first opening 110u is circular in the top view (as shown in FIG. 2B). The first channel layer 115, the first gate dielectric layer 116 and the first gate 117 are disposed in the hole wall of the first opening 110u along the first direction D1. That is, the first gate 117 may be columnar, the first gate dielectric layer 116 is disposed on the first gate 117, and the first channel layer 115 is disposed at an outer side of the first gate dielectric layer 116 and the first gate 117. That is, the first gate dielectric layer 116 is disposed between the first gate 117 and the first channel layer 115, and the first channel layer 115 is disposed between the first gate dielectric layer 116 and the hole wall of the first opening 110u. In addition, a portion of the first channel layer 115 and a portion of the first gate dielectric layer 116 protrude and overlap above the first source 114 and the first drain 112 in the first direction D1. In detail, a portion of the first channel layer 115 and a portion of the first gate dielectric layer 116 extend outward on the upper surface of the first source 114, and another portion of the first channel layer 115 and another portion of the first gate dielectric layer 116 extend in the first opening 110u. Therefore, portions of the first channel layer 115 and the first gate dielectric layer 116 outside and inside the first opening 110u are bent to each other, so that the first channel layer 115 and the first gate dielectric layer 116 have L-shaped cross-section (as shown in FIG. 2A), respectively. In the present embodiment, the first gate 117 can be cylindrical. In other embodiments, the first gate 117 can be an elliptical column, a rectangular column or other geometric column.

In the top view as shown in FIG. 2B, the first gate 117 is circular, and the first channel layer 115 and the first gate dielectric layer 116 are annular respectively. Since the first channel layer 115 of the present disclosure is annular, when the radius of the annular first channel layer 115 is R, the circumference of the first channel layer 115 is $2\pi R$, and the corresponding channel width is $2\pi R$. Compared with a comparative example in which the channel layer straightly extends on the plane parallel to the upper surface 100a (corresponding to a channel width of 2R), the channel width of the present disclosure is larger (for example, at least 3 times), so it can provide a larger current.

In one embodiment, the material of the first channel layer 115 includes semiconducting oxide, such as indium oxide (INO), indium zinc oxide (IZO), indium gallium zinc oxide (IGZO), an arbitrary combination thereof, or other suitable semiconducting oxides. The material of the first drain 112, the first source 114, and the first gate 117 is conductive material, and the conductive material is, for example, metal (such as titanium, titanium nitride, a combination thereof, or other suitable materials). The material of the first dielectric layer 113 and the first gate dielectric layer 116 is, for example, a dielectric material. The material of the first dielectric layer 113 is, for example, low temperature oxide (LTO) or other suitable materials. The material of the first gate dielectric layer 116 is, for example, a high-k dielectric material. In addition, since the first channel layer 115 is formed by atomic layer deposition (ALD), the atomic layer deposition is suitable for forming a high aspect ratio coating, so that the first channel layer 115 can be well conformal to the profile of the first opening 110u, so the first channel layer 115 has a high carrier mobility (for example, 100 cm$^2$/Vs).

Figure 3:
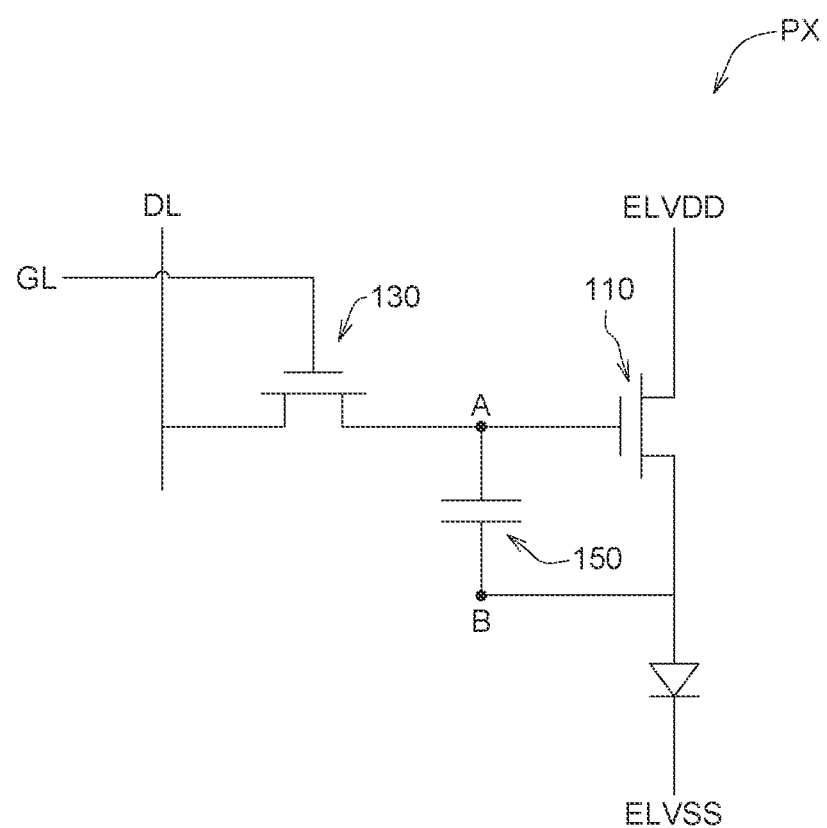
FIG. 3 shows an equivalent circuit diagram of a 2T1C driving circuit.

Please refer to FIG. 3. FIG. 3 shows the equivalent circuit diagram of the 2T1C driving circuit. The pixel PX may comprise a first transistor 110, a second transistor 130 and a capacitor 150. The capacitor 150 is formed between the first transistor 110 and the second transistor 130. The first transistor 110 is similar to the first transistor 110A as shown in FIGS. 2A-2B. The data line DL may be electrically connected to the source of the second transistor 130, and the gate line GL may be electrically connected to the gate of the second transistor 130. The drain of the second transistor 130 is electrically connected to the gate of the first transistor 110 and the capacitor 150 through the contact point A. The capacitor 150 is electrically connected to the drain of the first transistor 110 through the contact point B. The contact point A and contact point B are located on opposite sides of the capacitor 150. The source of the first transistor 110 is electrically connected to a first power supply ELVDD, and the drain of the first transistor 110 is electrically connected to a second power supply ELVSS. The voltage of the first power supply ELVDD is higher than the voltage of the second power supply ELVSS. For example, the first power supply ELVDD is a positive power supply voltage output, and the second power supply ELVSS is a negative power supply voltage output. According to some embodiments, the control signal is transmitted to the gate of the second transistor 130 via the gate line GL to turn on the second transistor 130. In other words, the control signal directly controls the second transistor 130 through the gate line GL. Therefore, the second transistor 130 is also called as "switching transistor". In addition, the first power supply ELVDD provides an electrical signal to the first transistor 110 to turn on the first transistor 110, and then the current flows to the light-emitting element to turn on the light of the light-emitting element. Since the constant bias voltage between the first power supply ELVDD and the second power supply ELVSS causes the first transistor 110 to provide a constant current to the current supplier when the first transistor 110 is turned on, the main function of the first transistor 110 is to provide the driving current required by the panel pixels. Therefore, the first transistor 110 is also called as "driving transistor". According to the present embodiment, the first transistor 110 of the present disclosure can provide a larger current after a three-dimensional improved design, and the second transistor 130 can help reduce the chance of leakage current.

Figure 4A:
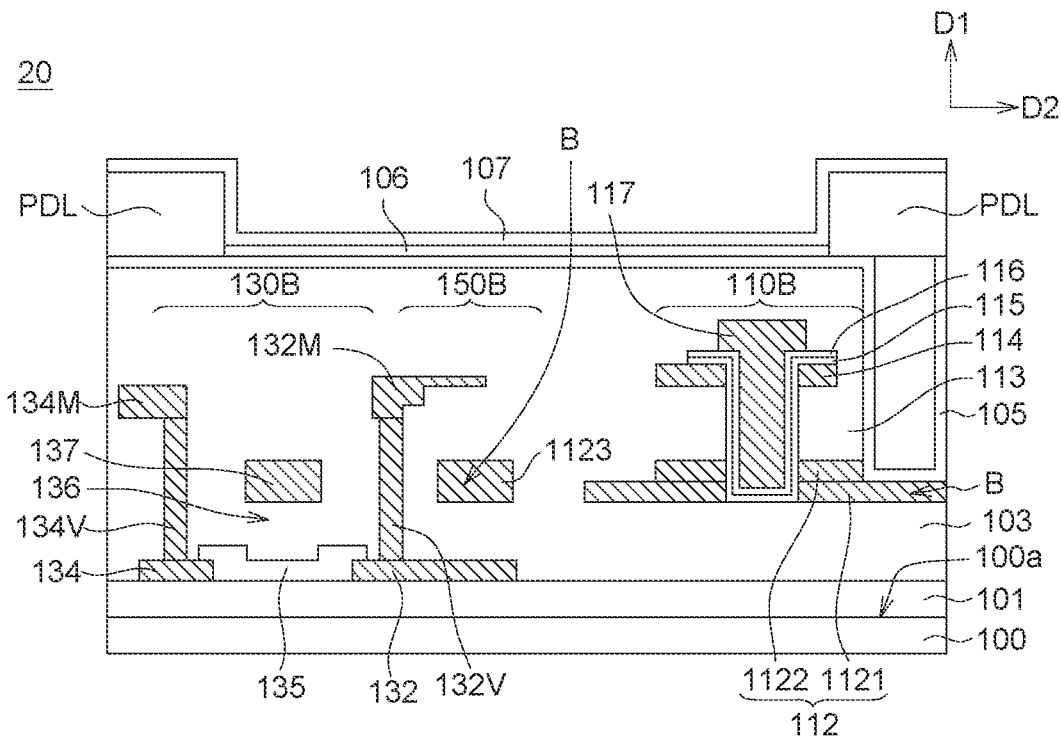
FIGS. 4A and 4B show cross-sectional views of an embodiment of an all-oxide transistor structure designed in accordance with the equivalent circuit diagram of the 2T1C driving circuit as shown in FIG. 3 from different viewing angles, respectively.
Figure 4B:
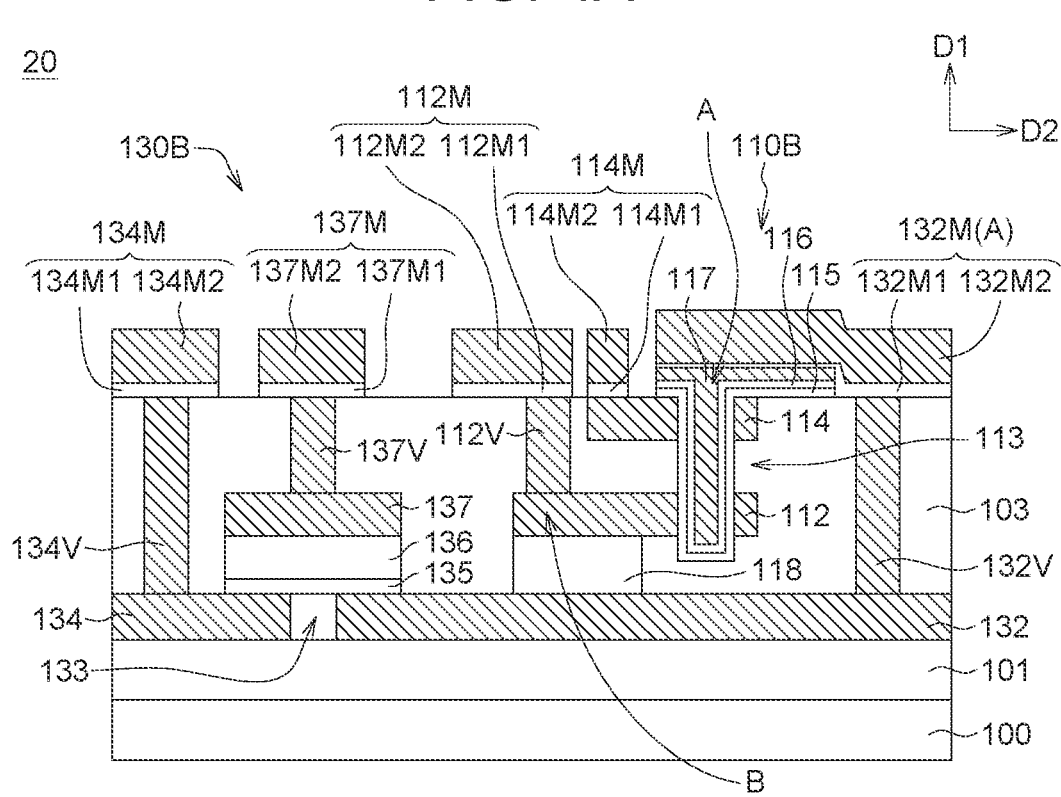

FIGS. 4A and 4B show cross-sectional views of an embodiment of an all-oxide transistor structure 20 designed in accordance with the equivalent circuit diagram of the 2T1C driving circuit as shown in FIG. 3 from different viewing angles, respectively. The all-oxide transistor structure 20 can correspond to the equivalent circuit diagram as shown in FIG. 3. The all-oxide transistor structure 20 includes a substrate 100, a buffer layer 101, an insulating layer 103, a first transistor 110B, a second transistor 130B and a capacitor 150B. The buffer layer 101 is formed on the upper surface 100a of the substrate 100. The first transistor 110B, the second transistor 130B and the capacitor 150B are formed on the buffer layer 101, and the capacitor 150B is formed between the first transistor 110B and the second transistor 130B. The insulating layer 103 is, for example, a multi-layer structure, and FIGS. 4A-4B can be simplified schematic diagrams. The first transistor 110B, the second transistor 130B and the capacitor 150B may respectively correspond to the first transistor 110, the second transistor 130 and the capacitor 150 as shown in FIG. 3. The structure of the first transistor 110B is similar to the structure of the above-mentioned first transistor 110A, and the detailed structure will not be repeatedly described. The first drain 112 of the first transistor 110B extends toward the second transistor 130B, and is formed as a capacitor electrode 1123 at a portion adjacent to the second transistor 130B. The contact point where the capacitor electrode 1123 and the first drain 112 are connected to each other as shown in FIG. 4A may correspond to the contact point B as shown in FIG. 3. In some embodiments, the first drain 112 includes a first portion 1121 and a second portion 1122 vertically stacked with each other. For example, a width of the first portion 1121 in the second direction D2 is greater than a width of the second portion 1122 in the second direction D2. The second direction D2 is, for example, parallel to the upper surface 100a.

Please refer to FIGS. 4A-4B at the same time. The second transistor 130B includes a second drain 132, a second source 134, a second channel layer 135 and a second gate 137. The second drain 132 and the second source 134 are disposed on the substrate 100. The second drain 132 and the second source 134 are disposed on the substrate 100 and the buffer layer 101 and are separated from each other in the second direction D2. The second channel layer 135 is disposed between the second drain 132 and the second source 134. The second gate dielectric layer 136 and the second gate 137 are disposed on the second channel layer 135, and the second gate dielectric layer 136 is disposed between the second gate 137 and the second channel layer 135. As shown in FIG. 4A, a pixel definition layer PDL, an anode 105 of a light-emitting element, the light-emitting layer 106 of the light-emitting element, and a cathode 107 of the light-emitting element are formed above the first transistor 110B and the second transistor 130B, wherein the anode of the light-emitting element 105 is electrically connected to the first drain 112 of the first transistor 110B.

In addition, please refer to FIG. 4B, a bottom dielectric layer 118 is disposed between the first drain 112 and the second drain 132. Contacts 134V, 137V, 132V and 112V and conductors 134M, 137M, 132M and 112M are respectively formed above the second source 134, the second gate 137, the second drain 132 and the first drain 112. Conductors 134M, 137M, 132M and 112M respectively comprise first metal layers 134M1, 137M1, 132M1 and 112M1 and second metal layers 134M2, 137M2, 132M2 and 112M2. Furthermore, the conductor 132M is in electrical contact with the first gate 117 and the contact 132V (that is, the conductor 132M and the first gate 117 have the same potential, corresponding to the contact point A), but the conductor 132M does not contact the first channel layer 115, and the insulation between the conductor 132M and the first channel layers 115 can be achieved by a special etching process, as described in the subsequent paragraph [0026]. The second drain 132 of the second transistor 130B extends along the second direction D2 and is electrically connected to the first gate 117 of the first transistor 110B through the contact 132V and the conductor 132M. The contact point between the second drain and the first gate 117 may correspond to the contact point A as shown in FIG. 3. The data line DL (as shown in FIG. 3) is electrically connected to the second source 134 through the conductor 134M and the contact 134V. The gate line GL (as shown in FIG. 3) is electrically connected to the second gate 137 through the conductor 137M and the contact 137V. The first drain 112 is electrically connected to the capacitor 150B and the second power supply ELVSS (as shown in FIG. 3) through the contact 112V and the conductor 112M to transfer current to the light-emitting element. The contact point between the first drain 112 and the capacitor 150B may correspond to the contact point B as shown in FIG. 3. The first source 114 is electrically connected to the first power supply ELVDD (as shown in FIG. 3) through the conductor 114M.

In one embodiment, the material of the second channel layer 135 includes a semiconducting oxide. In one embodiment, the materials of the first channel layer 115 and the second channel layer 135 may be different from each other, but the present disclosure is not limited thereto. In another embodiment, the materials of the first channel layer 115 and the second channel layer 135 may be identical to each other. The material of the buffer layer 101 is, for example, thermal oxide or other suitable materials. The material of the second gate dielectric layer 136 and the material of the bottom dielectric layer 118 are, for example, a high-k dielectric material or other suitable materials. In addition, although FIG. 4B shows that the sidewalls of the first channel layer 115, the first gate dielectric layer 116 and the first gate 117 are aligned with each other in the first direction D1, this is a simplified schematic diagram. In fact, the sidewall of the first channel layer 115 is relatively retracted. Therefore, the first channel layer 115 and the conductor 132M are electrically isolated from each other and have no contact.

In the all-oxide transistor structure 20 of the present disclosure, the connection between the first transistor 110B and the second transistor 130B is achieved through the contacts 112V, 132V and the conductors 112M and 132M, and no additional jump wire is required. Accordingly, the manufacturing process can be simplified and the time and cost can be saved. In the present disclosure, "all-oxide transistor structure" is defined as the channel layers of all transistors in this three-dimensional 2T1C circuit structure using the material of semiconducting oxide as channels. For example, as shown in FIGS. 4A and 4B, the materials of the first channel layer 115 and the second channel layer 135 both comprise the material of semiconducting oxide. In one embodiment, the material of the first channel layer 115 and the material of the second channel layer 135 may be the same as each other; in another embodiment, the material of the first channel layer 115 and the material of the second channel layer 135 may be different from each other. As long as the first channel layer 115 and the second channel layer 135 are both made of the material of semiconducting oxide, this falls within the scope of the present disclosure. The effect of the "all-oxide transistor structure" is a low-temperature, large-area process, which can control the overall process temperature within 500 degrees Celsius. It is beneficial to simplify the process and save process time and cost.

In the embodiments as shown in FIGS. 2A-2B and 4A-4B, the all-oxide transistor structures 10 and 20 respectively have a first opening 110u. However, the present disclosure is not limited thereto. In other embodiments, the number of the first openings can be plural, as shown in FIGS. 5A-5B.

Figure 5A:
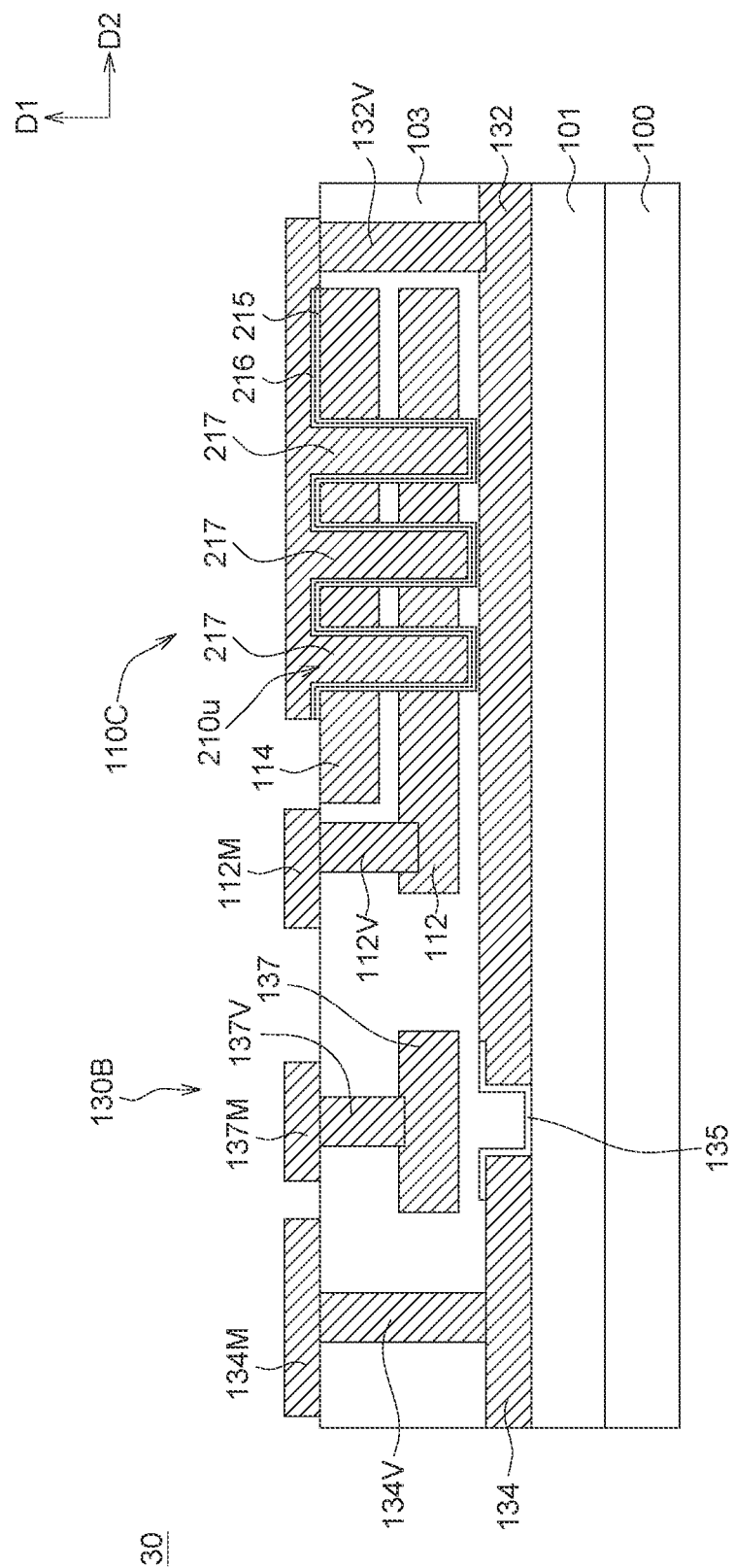
FIG. 5A shows a cross-sectional view of an all-oxide transistor structure of another embodiment designed according to the equivalent circuit diagram of the 2T1C driving circuit as shown in FIG. 3.
Figure 5B:
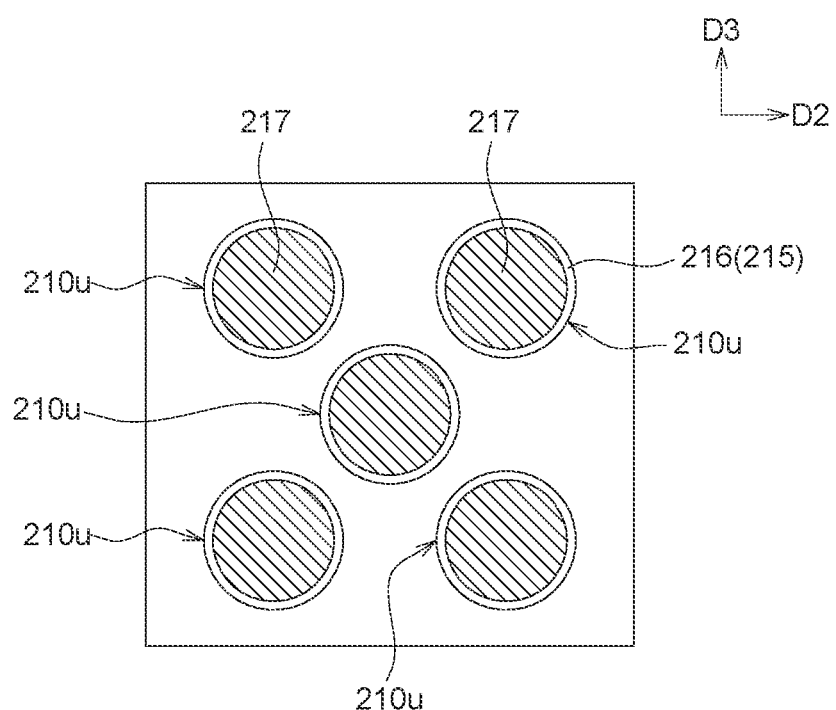
FIG. 5B shows a partial top view of the all-oxide transistor structure of FIG. 5A.

FIG. 5A shows a cross-sectional view of an all-oxide transistor structure 30 of another embodiment designed according to the equivalent circuit diagram of the 2T1C driving circuit as shown in FIG. 3. FIG. 5B shows a partial top view of the all-oxide transistor structure 30 of FIG. 5A. Please refer to FIGS. 5A-5B at the same time. In the first transistor 110C of the all-oxide transistor structure 30, the number of the first openings 210u is one or more. In FIG. 5B, five first openings 210u are shown, but the present disclosure is not limited thereto. The first openings 210u are separated from each other. In the top view as shown in FIG. 5B, the first openings 210u may each be circular, but the present disclosure is not limited thereto. As shown in FIG. 5A, the first channel layer 215, the first gate dielectric layer 216 and the first gate 217 are disposed (for example, continuously extend) in the plurality of first openings 210u. Since the number of the first channel layers 215 is linearly proportional to the driving current, the first channel layers 215 in the plurality of first openings 210u can achieve parallel connection of channels. Therefore, compared with the comparative example having one first opening, the first transistor 110C can have a larger channel width, and therefore can provide a larger current. In other embodiments, the first channel layers 215 does not continuously extend (i.e., disconnected) in the plurality of first openings 210u. The first channel layers 215 in different first openings 210u can be disconnected from each other, but the effect of parallel connection of channels can still be achieved (not shown).

FIGS. 6A-6J show a fabrication flow chart of the all-oxide transistor structure 10 according to FIGS. 2A-2B.

Figure 6A:
FIGS. 6A-6J show a fabrication flow chart of the all-oxide transistor structure according to FIGS. 2A-2B.

First, as shown in FIG. 6A, a substrate 100 is provided. The substrate 100 is, for example, a silicon substrate, a sapphire substrate, a glass substrate or other suitable substrate.

Figure 6B:
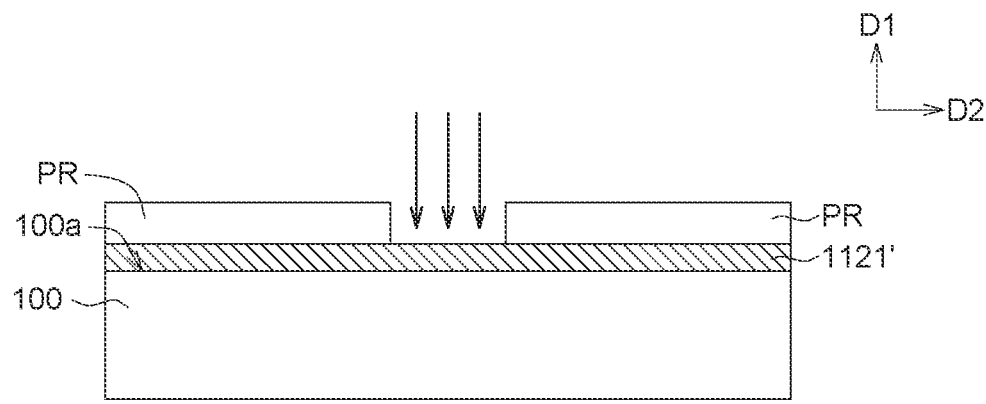

Next, as shown in FIG. 6B, a lower conductive material layer 1121' is formed on the substrate 100, and a photoresist PR is formed on the lower conductive material layer 1121'. The lower conductive material layer 1121' is formed, for example, by a deposition method.

Figure 6C:
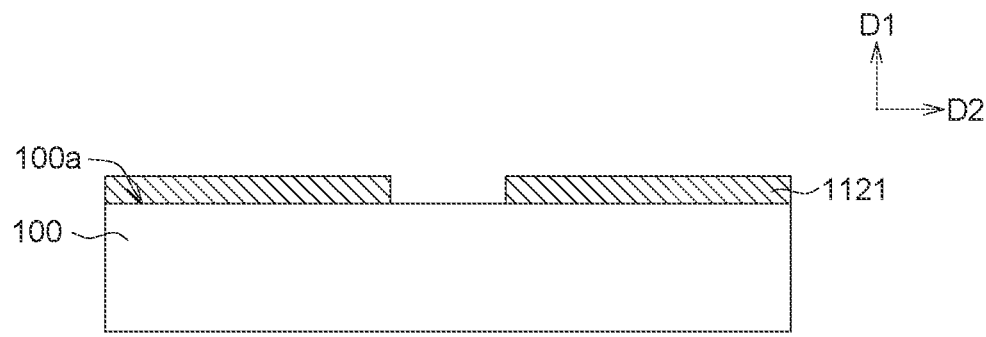

As shown in FIG. 6C, the lower conductive material layer 1121' that is not shielded by the photoresist PR is removed through an etching process (such as dry etching), and then the photoresist PR is removed. The remaining lower conductive material layer 1121' is formed as a first portion 1121 of the first drain 112 on the substrate 100.

Figure 6D:
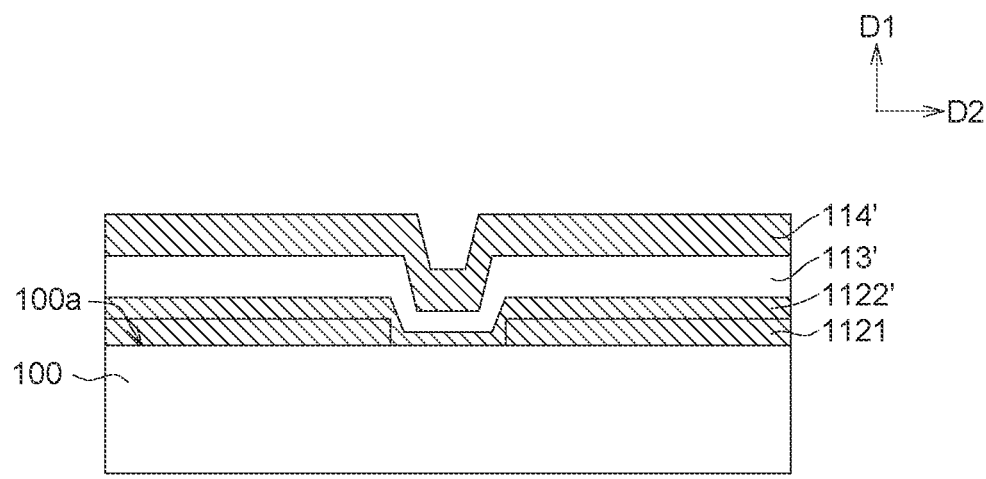

As shown in FIG. 6D, a lower conductive material layer 1122', an insulating material layer 113' and an upper conductive material layer 114' are sequentially formed on the substrate 100 and the first portion 1121. The lower conductive material layer 1122', the insulating material layer 113' and the upper conductive material layer 114' are formed, for example, by a deposition method.

Figure 6E:
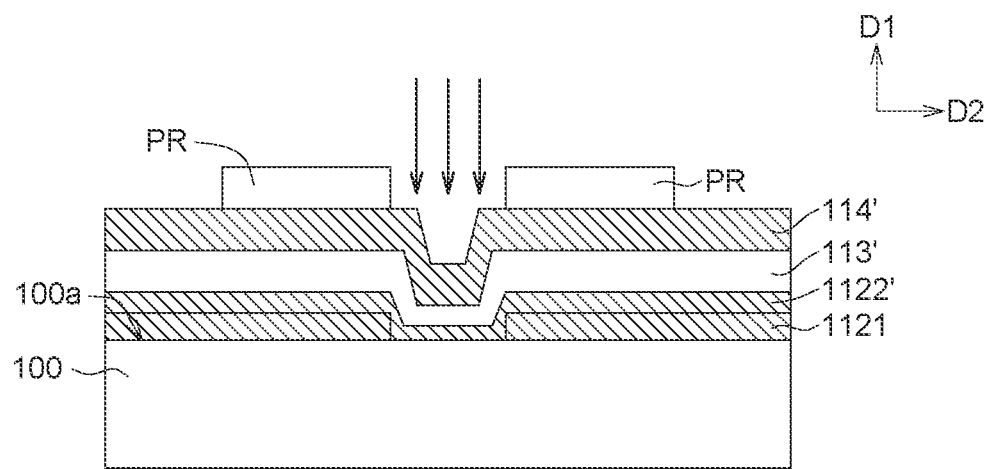

As shown in FIG. 6E, a photoresist PR is formed on the upper conductive material layer 114'.

Figure 6F:
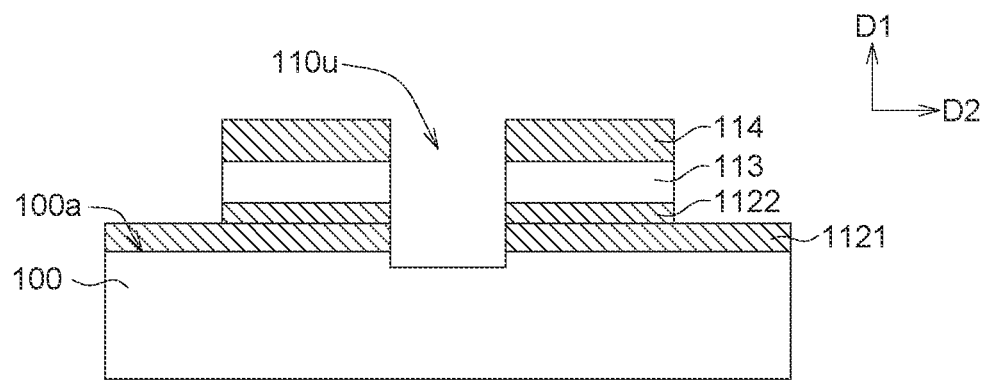

As shown in FIG. 6F, portions of the lower conductive material layer 1122', the insulating material layer 113' and the upper conductive material layer 114' (not shielded by the photoresist PR) are removed through the etching process to form a first opening 110u passing through the lower conductive material layer 1122', the insulating material layer 113' and the upper conductive material layer 114' along the first direction D1, and then the photoresist PR is removed. The remaining lower conductive material layer 1122' is formed as a second portion 1122 on the first portion 1121, and the first portion 1121 and the second portion 1122 constitute the first drain 112; the remaining insulating material layer 113' is formed as a first dielectric layer 113 on the first drain 112; the remaining upper conductive material layer 114' is formed as a first source 114 on the first dielectric layer 113. In the present embodiment, the first opening 110u is formed by a dry etching process.

Figure 6G:
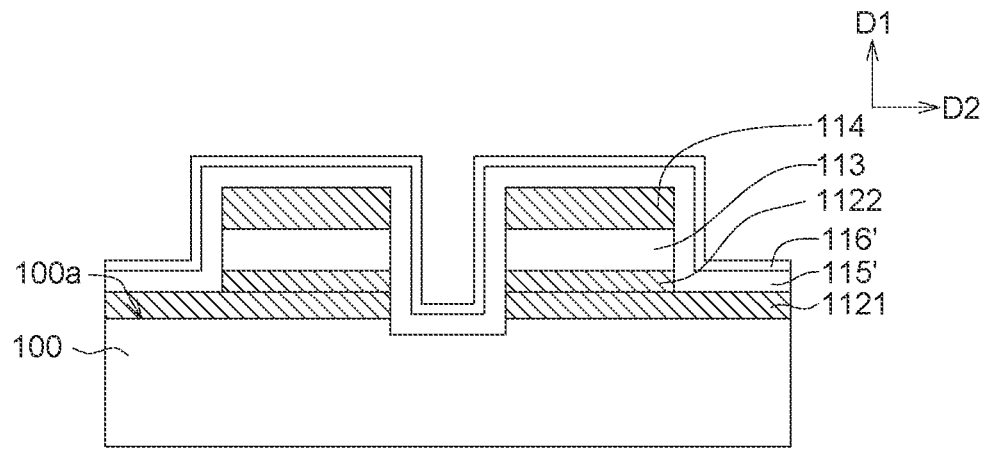

As shown in FIG. 6G, a channel material layer 115' and a top dielectric material layer 116' are sequentially formed on the first source 114 and in the first opening 110u. The channel material layer 115' and the top dielectric material layer 116' are formed by, for example, atomic layer deposition (ALD).

Figure 6H:
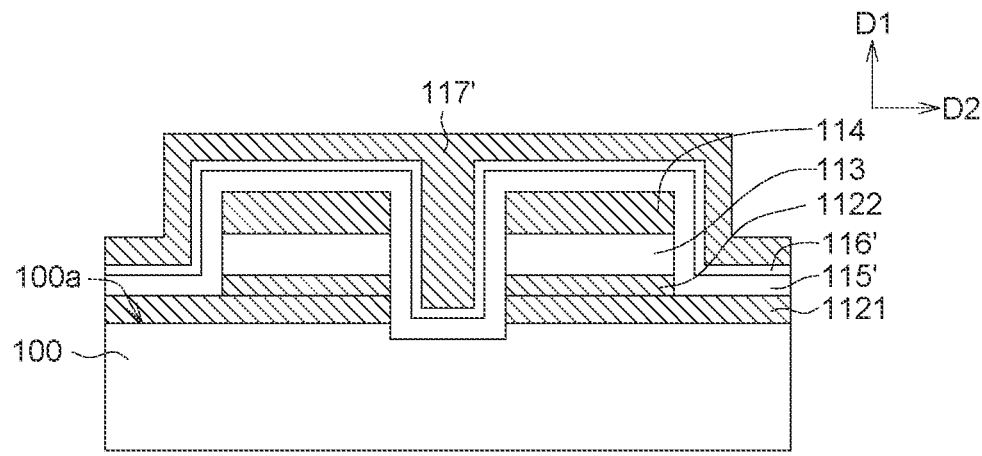

As shown in FIG. 6H, a gate material layer 117' is formed on the top dielectric material layer 116'.

Figure 6I:
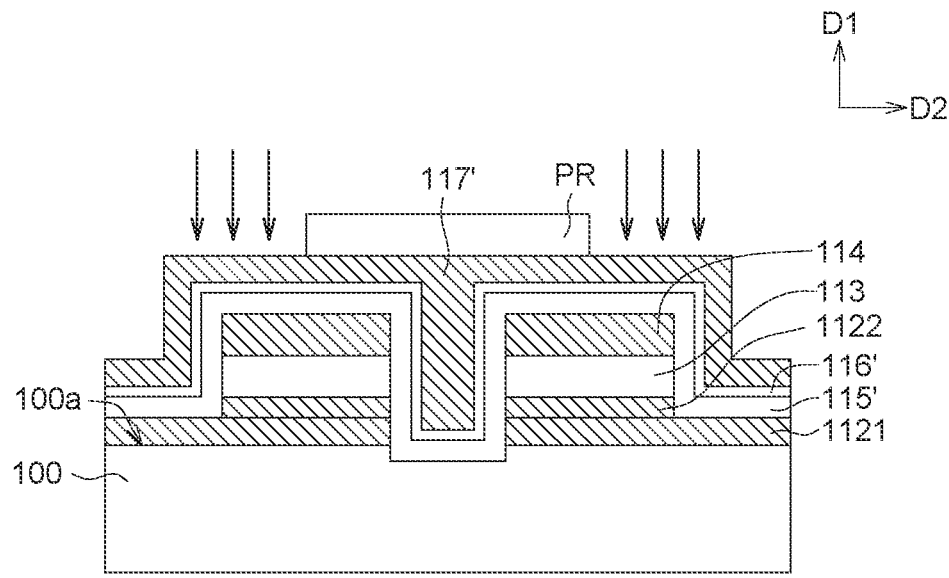

As shown in FIG. 6I, a photoresist PR is formed on the gate material layer 117'.

Figure 6J:
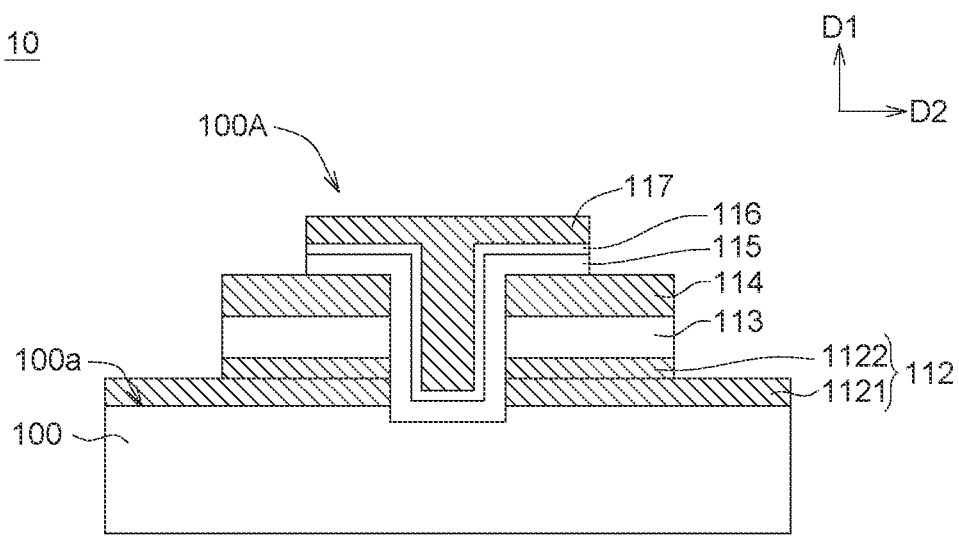

As shown in FIG. 6J, portions of the channel material layer 115', the top dielectric material layer 116' and the gate material layer (not shielded by the photoresist PR) are removed by an etching process (such as dry etching) 117', and then the photoresist PR is removed. The remaining channel material layer 115' is formed as the first channel layer 115 on the first source 114 and in the first opening 110u; the remaining top dielectric material layer 116' is formed as the first gate dielectric layer 116 on the first source 114 and in the first opening 110u; the remaining gate material layer 117' is formed as the first gate 117 on the first source 114 and in the first opening 110u. In this way, the all-oxide transistor structure 10 comprising the first transistor 110A is formed as shown in FIGS. 2A-2B. Since the first channel layer 115 of the first transistor 110A is formed by the atomic layer deposition, compared to the comparative example in which the channel layer is formed by the chemical vapor deposition (CVD), the first channel layer 115 can have higher carrier mobility. Furthermore, the atomic layer deposition can be used to uniformly coat nanometer-scale films on the walls of cylindrical tubes with high aspect ratios. In contrast, it is difficult for general chemical vapor deposition to achieve coating on geometric structures with high aspect ratios.

FIGS. 7-44 show a fabrication flow chart of the all-oxide transistor structure 20 according to FIGS. 4A-4B, in which the elements in the all-oxide transistor structure 20 that are the same or similar to the all-oxide transistor structure 10 are labeled in the same or similar reference numerals, and the same material for the same component will not be described in detail.

Figure 7:
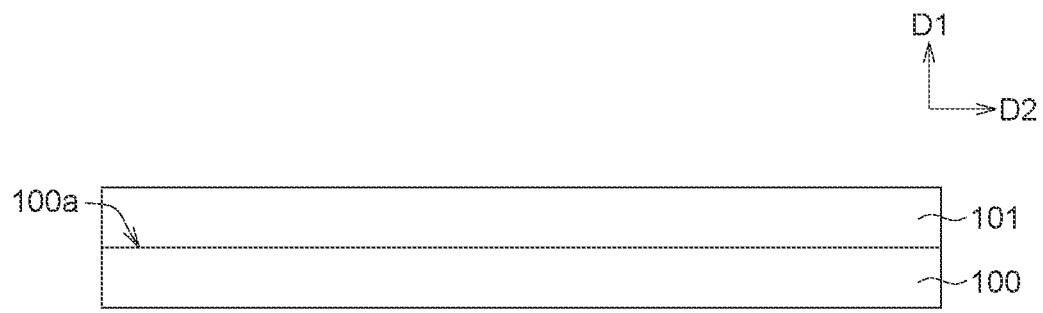
FIGS. 7-44 show a fabrication flow chart of the all-oxide transistor structure according to FIGS. 4A-4B.

First, please refer to FIG. 7, a substrate 100 is provided and a buffer layer 101 is stacked on the substrate 100.

Figure 8:
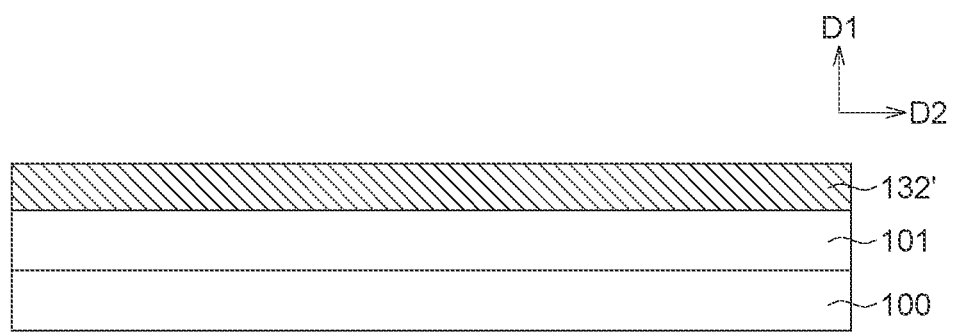

Next, as shown in FIG. 8, a bottom conductive material layer 132' is formed on the structure as shown in FIG. 7. For example, the bottom conductive material layer 132' is formed on the substrate 100 and the buffer layer 101 by a deposition method.

Figure 9:
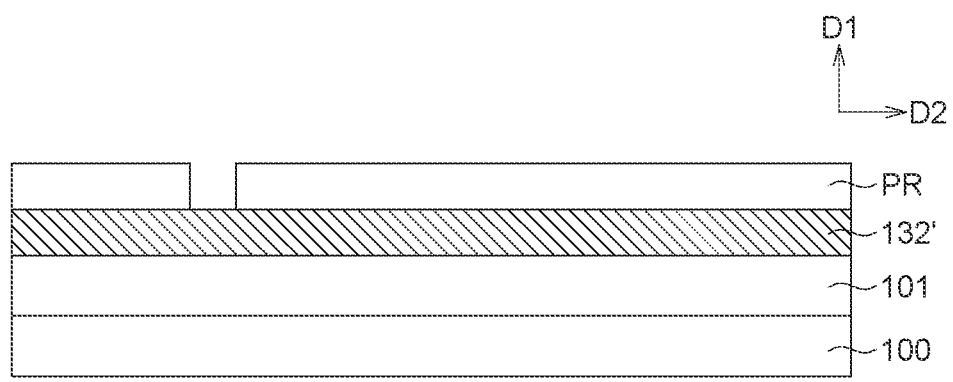

As shown in FIG. 9, a photoresist PR is formed on the bottom conductive material layer 132'.

Figure 10:
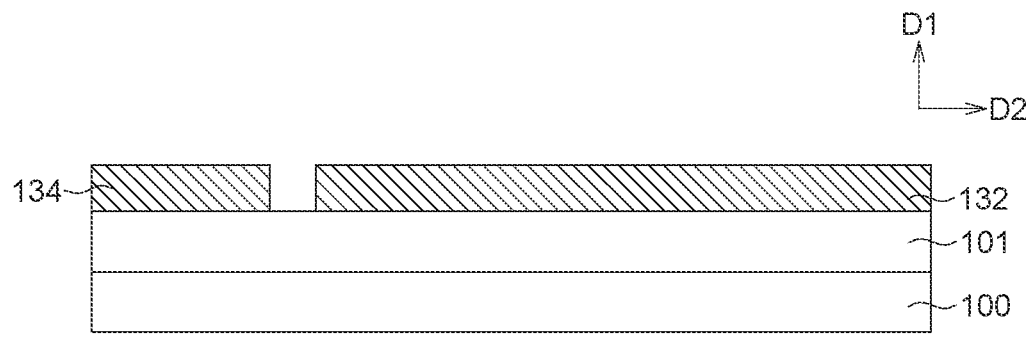

As shown in FIG. 10, a portion of the bottom conductive material layer 132' (not shielded by the photoresist PR) is removed by an etching process (such as dry etching), and the remaining bottom conductive material layers 132' is formed as a second source 134 and a second drain 132 separated from each other.

Figure 11:
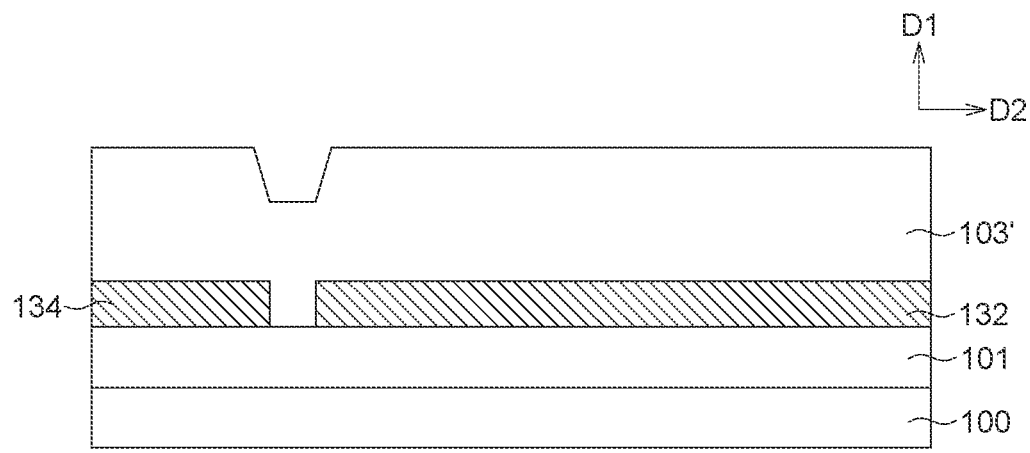

As shown in FIG. 11, an insulating material layer 103' is formed on the second source 134 and the second drain 132 and between the second source 134 and the second drain 132.

Figure 12:
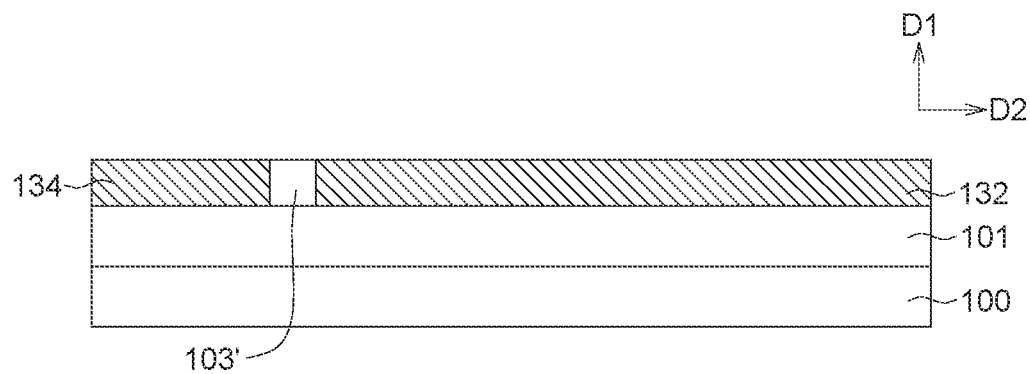

As shown in FIG. 12, the insulating material layer 103' disposed on the second source 134 and the second drain 132 is removed through a planarization process, and the remaining insulating material layer 103' is located between the second source 134 and the second drain 132, so that the second source 134 and the second drain 132 are electrically insulated from each other. The planarization process is, for example, chemical-mechanical polishing (CMP).

Figure 13:
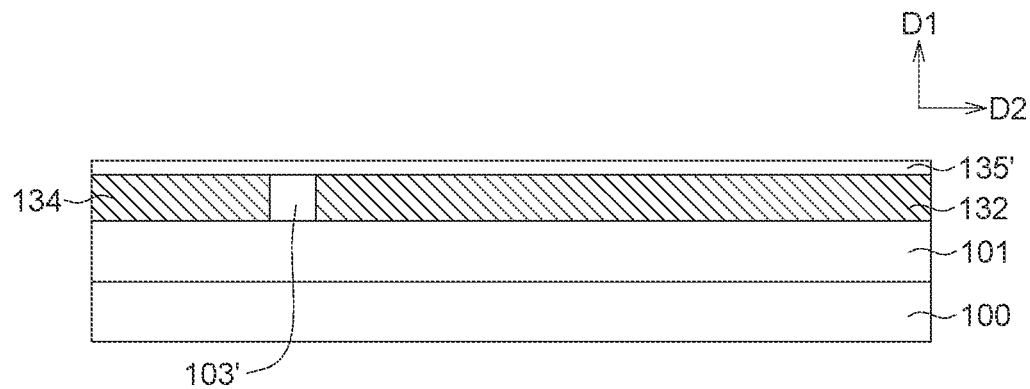

As shown in FIG. 13, a channel material layer 135' is formed on the second source 134 and the second drain 132 (for example, through a deposition process).

Figure 14:
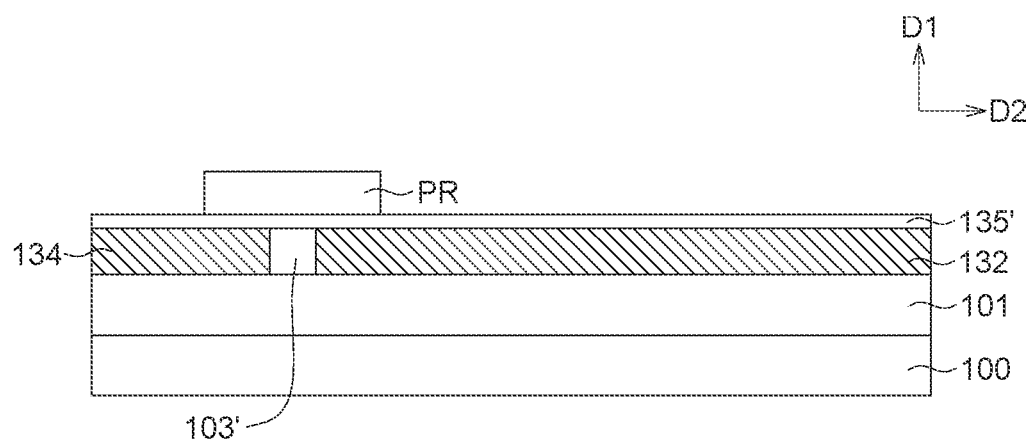

As shown in FIG. 14, a photoresist PR is formed on the channel material layer 135'.

Figure 15:
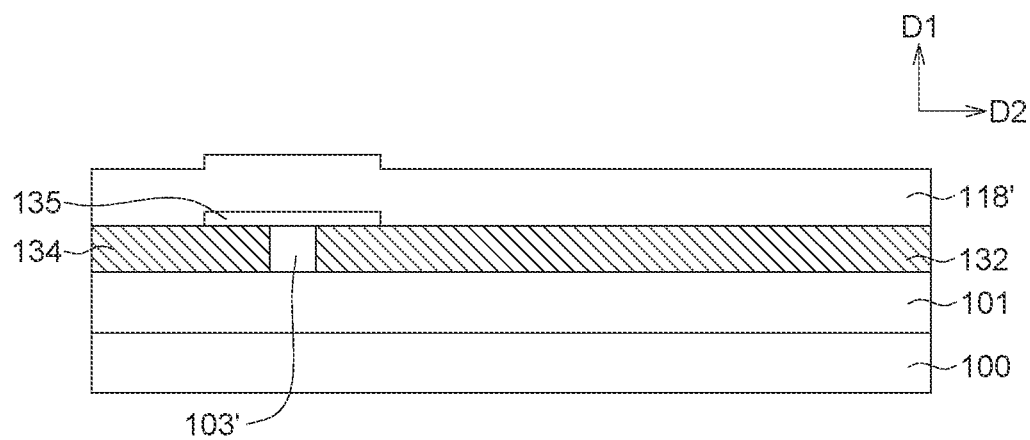

As shown in FIG. 15, a portion of the channel material layer 135' (not shielded by the photoresist) is removed (for example, through an etching process), and the remaining channel material layer 135' is formed as a second channel layer 135 connecting between the second source 134 and the second drain 132 on the second source 134 and the second drain 132. Thereafter, a dielectric material layer 118' is formed on the second source 134, the second drain 132 and the second channel layer 135.

Figure 16:
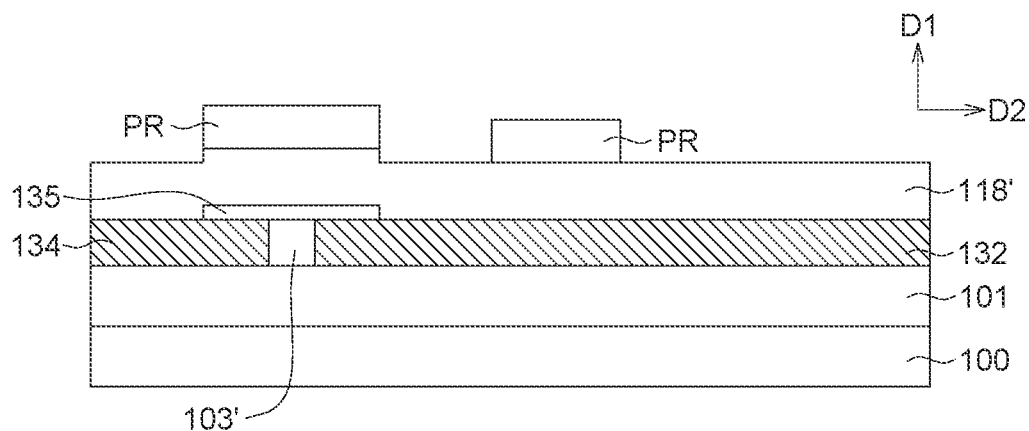

As shown in FIG. 16, a photoresist PR is formed on the dielectric material layer 118'.

Figure 17:
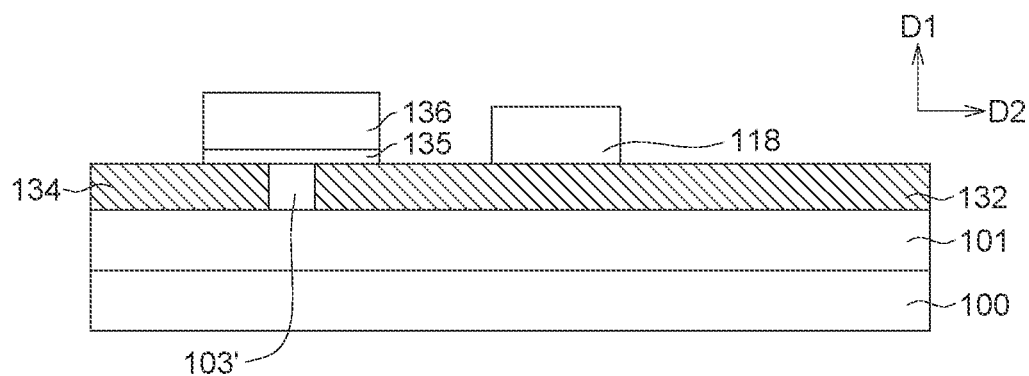

As shown in FIG. 17, a portion of the dielectric material layer 118' (not shielded by the photoresist PR) is removed (for example, by dry etching), and the remaining dielectric material layer 118' disposed on the second channel layer 135 is formed as the second gate dielectric layer 136, and the remaining dielectric material layer 118' disposed on the second drain 132 is formed as the bottom dielectric layer 118.

Figure 18:
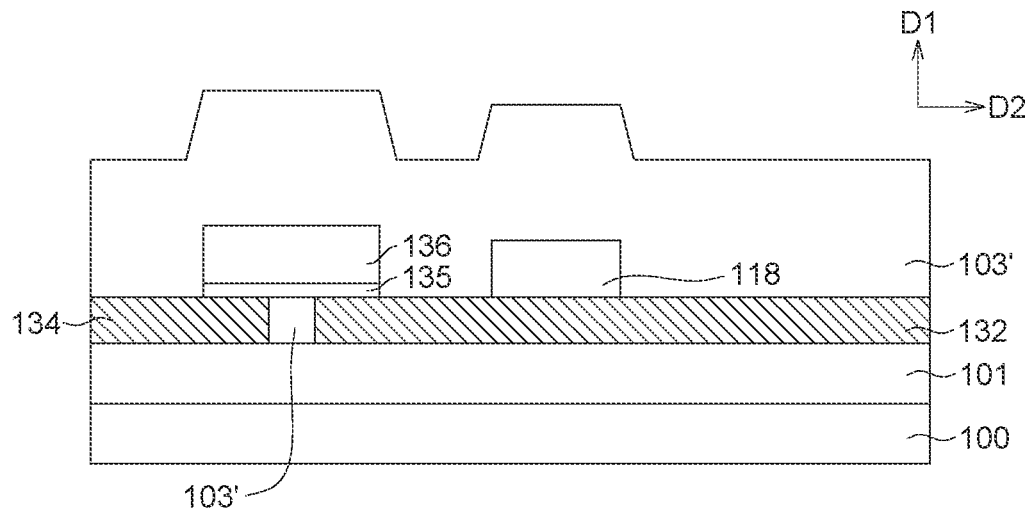

As shown in FIG. 18, an insulating material layer 103' is formed on the second source 134, the second gate dielectric layer 136, the second drain 132 and the bottom dielectric layer 118 (for example, by a deposition process).

Figure 19:
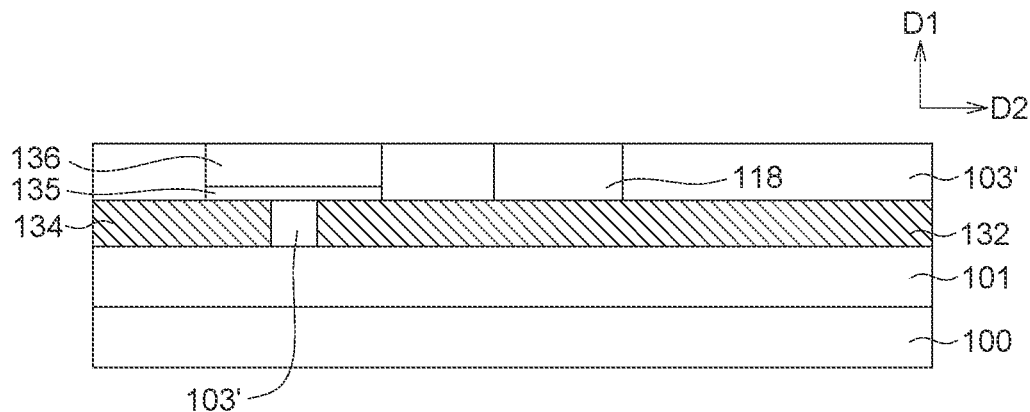

As shown in FIG. 19, the excess insulating material layer 103' is removed through a planarization process, and the upper surfaces of the second gate dielectric layer 136 and the bottom dielectric layer 118 are exposed. The planarization process is, for example, chemical-mechanical polishing (CMP).

Figure 20:
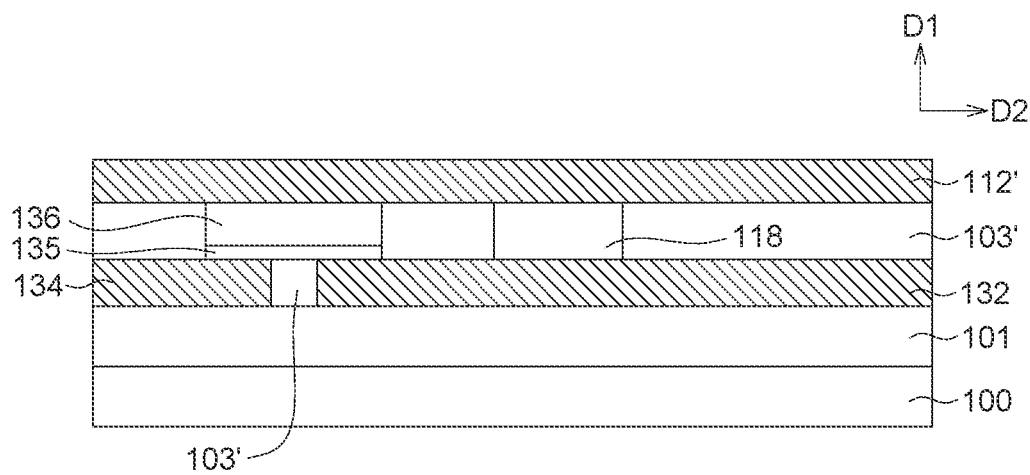

As shown in FIG. 20, a lower conductive material layer 112' is formed on the second gate dielectric layer 136 and the bottom dielectric layer 118 (for example, through a deposition process).

Figure 21:
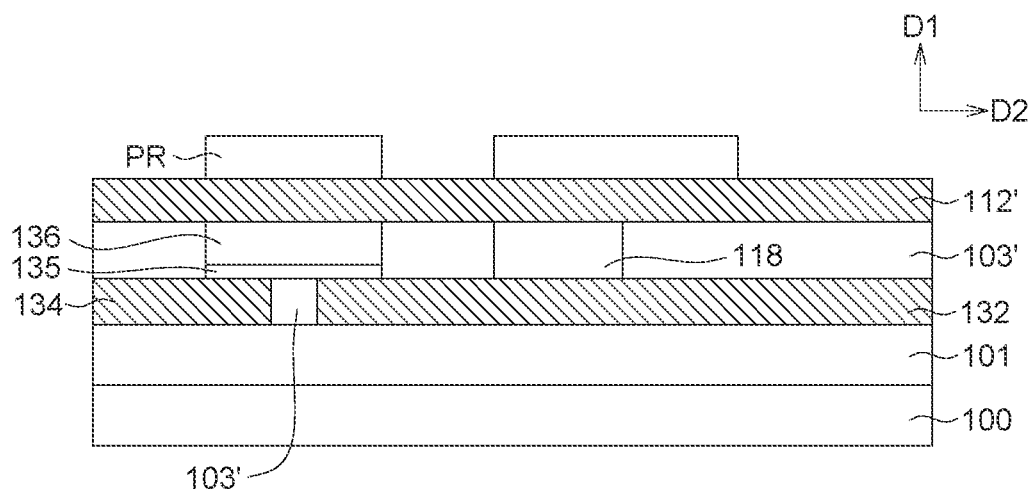

As shown in FIG. 21, a photoresist PR is formed on the lower conductive material layer 112'.

Figure 22:
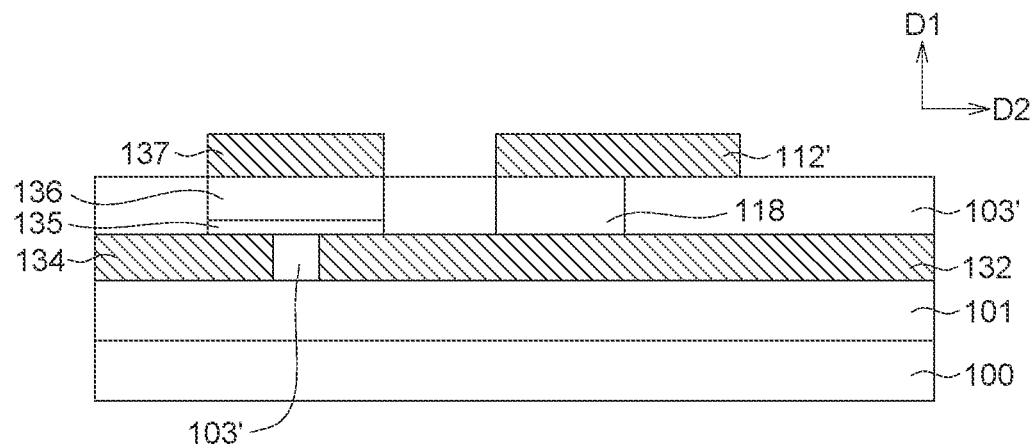

As shown in FIG. 22, a portion of the lower conductive material layer 112' (not shielded by the photoresist PR) is removed through an etching process (such as dry etching), and a portion of the remaining lower conductive material layer 112' disposed on the second gate dielectric layer 136 is formed as the second gate 137; another portion of the remaining lower conductive material layer 112' extends above the bottom dielectric layer 118 to form a high-k capacitor 150B.

Figure 23:
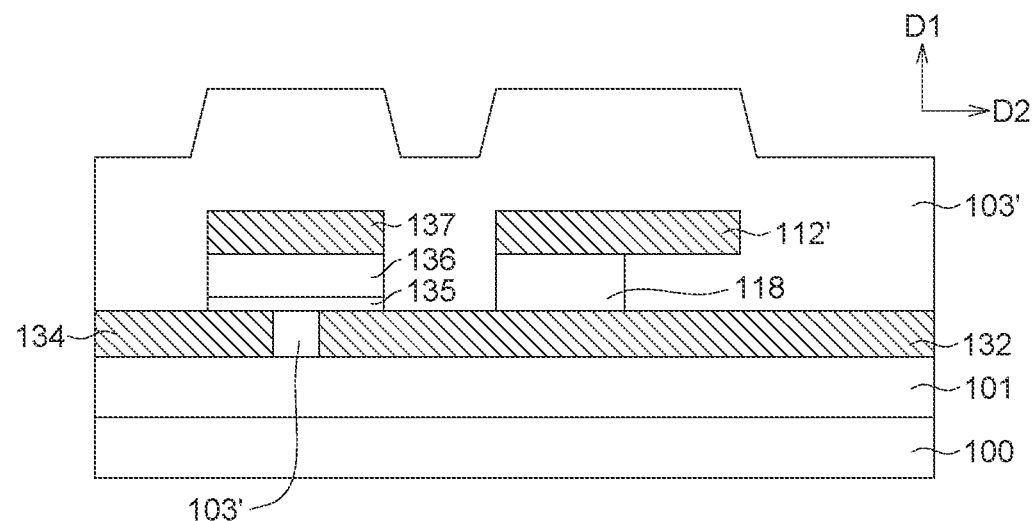

As shown in FIG. 23, an insulating material layer 103' is formed on the second gate 137 and the lower conductive material layer 112' (for example, through a deposition process).

Figure 24:
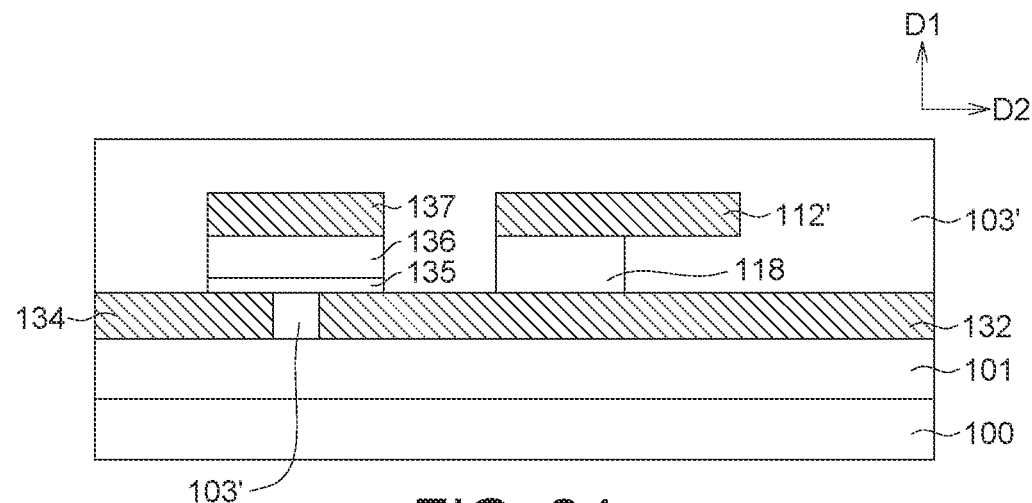

As shown in FIG. 24, the excess insulating material layer 103' is removed through a planarization process. The planarization process is, for example, chemical-mechanical polishing (CMP).

Figure 25:
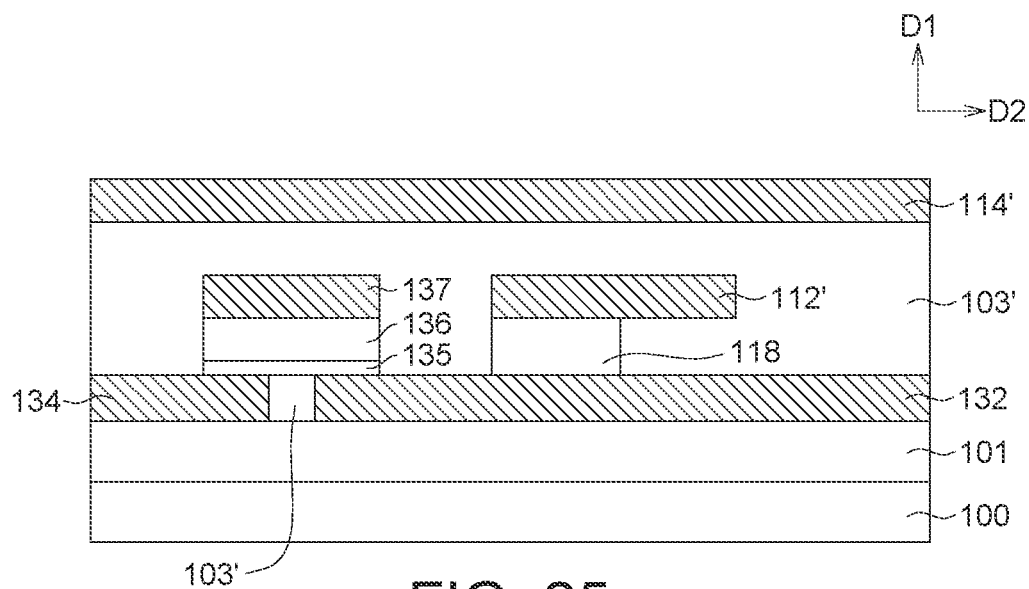

As shown in FIG. 25, an upper conductive material layer 114' is formed on the insulating material layer 103' as shown in FIG. 24.

Figure 26:
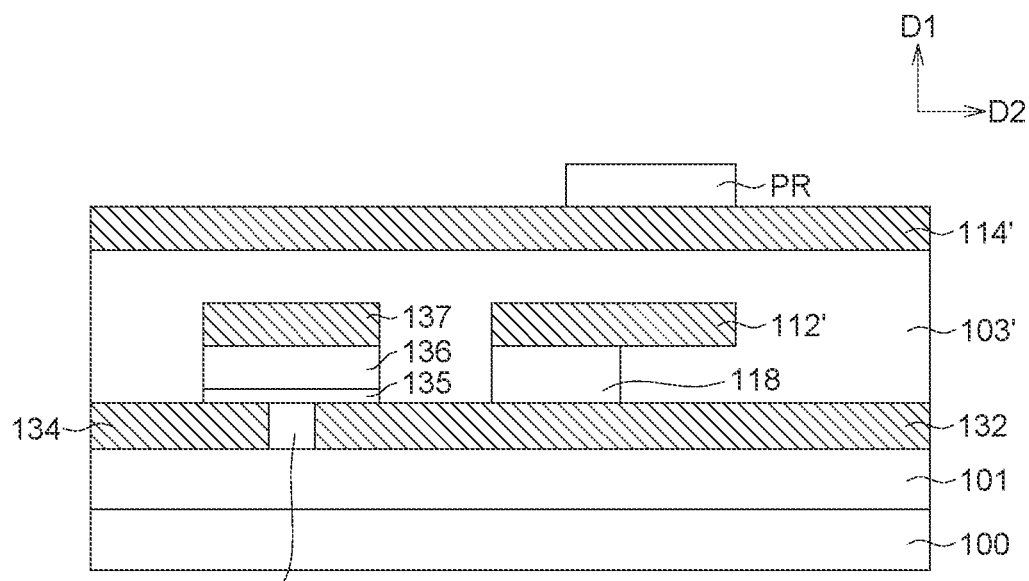

As shown in FIG. 26, a photoresist PR is formed on the upper conductive material layer 114'.

Figure 27:
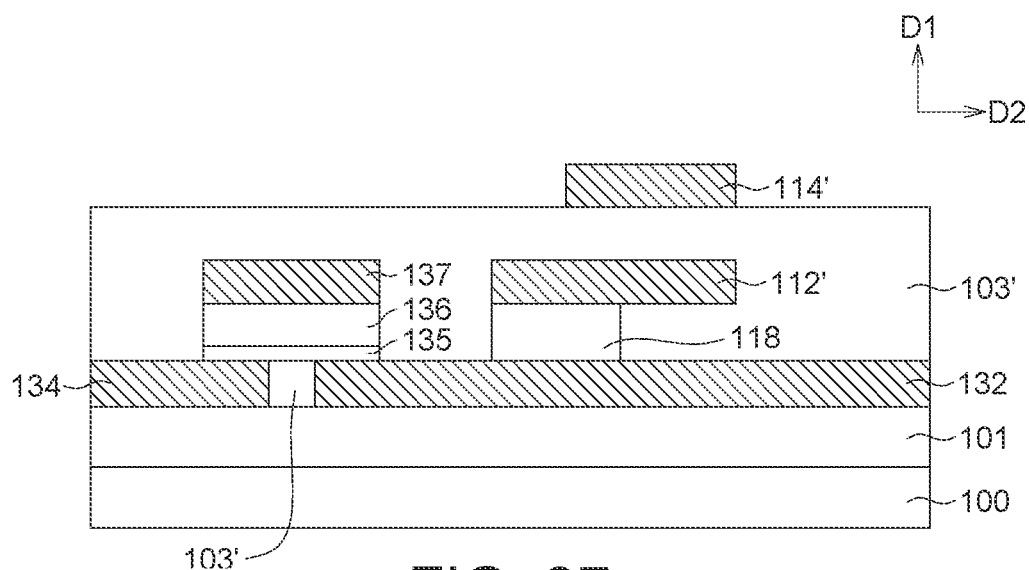

As shown in FIG. 27, a portion of the upper conductive material layer 114' (not shielded by the photoresist PR) is removed through the etching process. The remaining upper conductive material layer 114' is located on the lower conductive material layer 112', and overlaps the lower conductive material layer 112' in the first direction D1.

Figure 28:
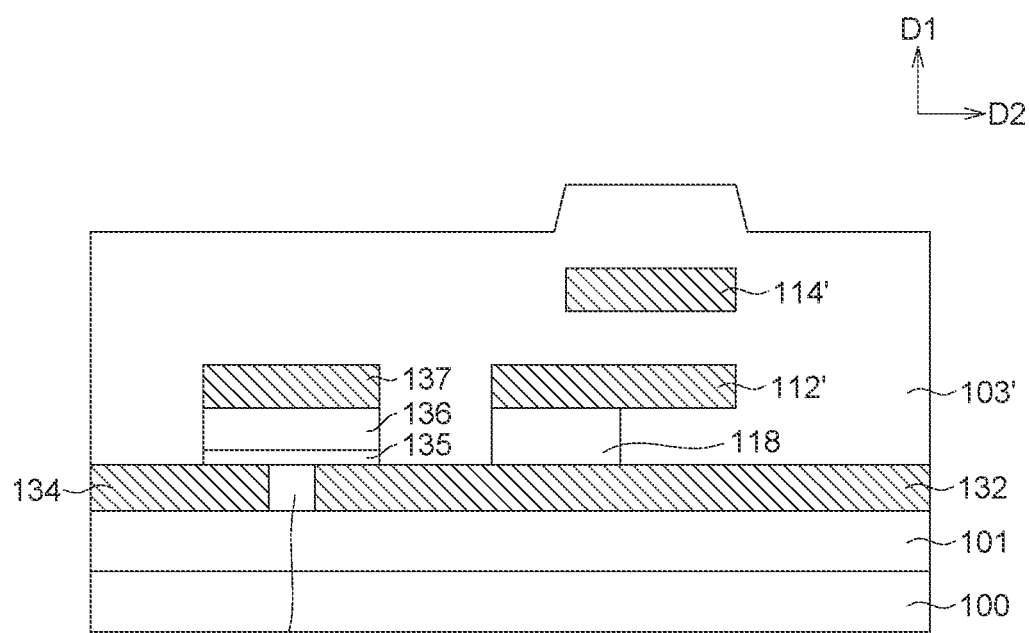

As shown in FIG. 28, an insulating material layer 103' is formed on the upper conductive material layer 114' (for example, by a deposition process).

Figure 29:
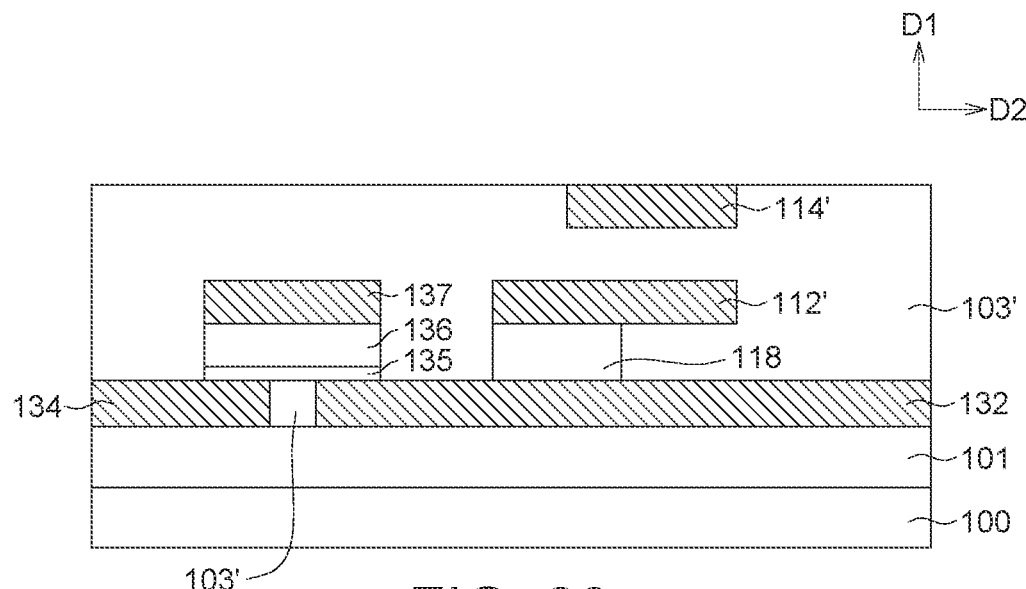

As shown in FIG. 29, the excess insulating material layer 103' is removed through a planarization process, and the upper surface of the upper conductive material layer 114' is exposed. The planarization process is, for example, chemical-mechanical polishing (CMP).

Figure 30:
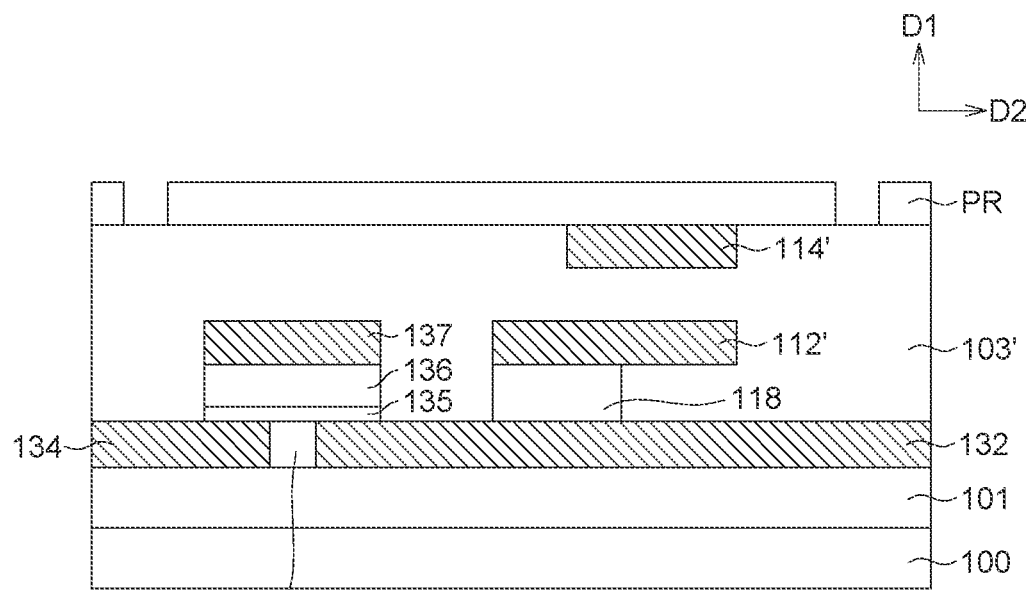

As shown in FIG. 30, a photoresist PR is formed on the upper conductive material layer 114' and the insulating material layer 103'.

Figure 31:
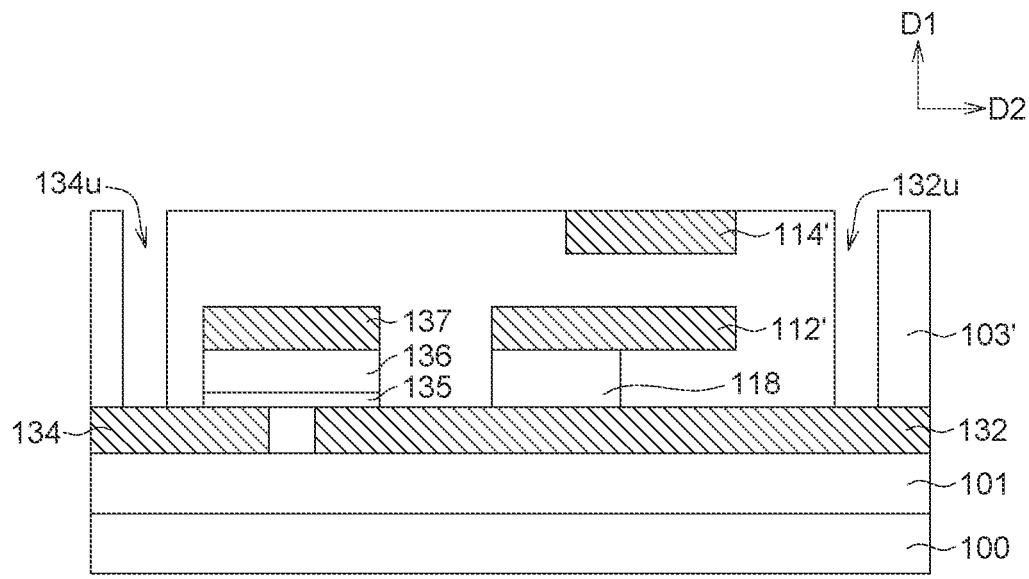

As shown in FIG. 31, a portion of the insulating material layer 103' (not shielded by the photoresist PR) is removed through an etching process (such as dry etching), and holes 134*u* and 132*u* are formed on the second source 134 and the second drain 132, respectively. The holes 134*u* and 132*u* extend along the first direction D1 and expose the upper surfaces of the second source 134 and the second drain 132, respectively.

Figure 32:
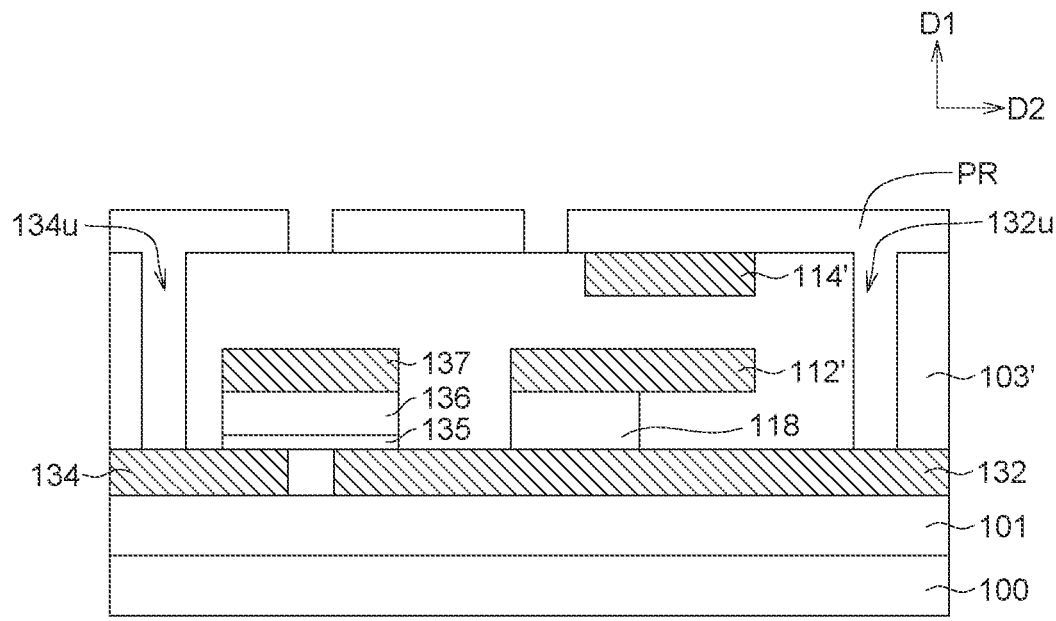

As shown in FIG. 32, a photoresist PR is formed in the holes 134*u* and 132*u* and on the insulating material layer 103' and the upper conductive material layer 114'.

Figure 33:
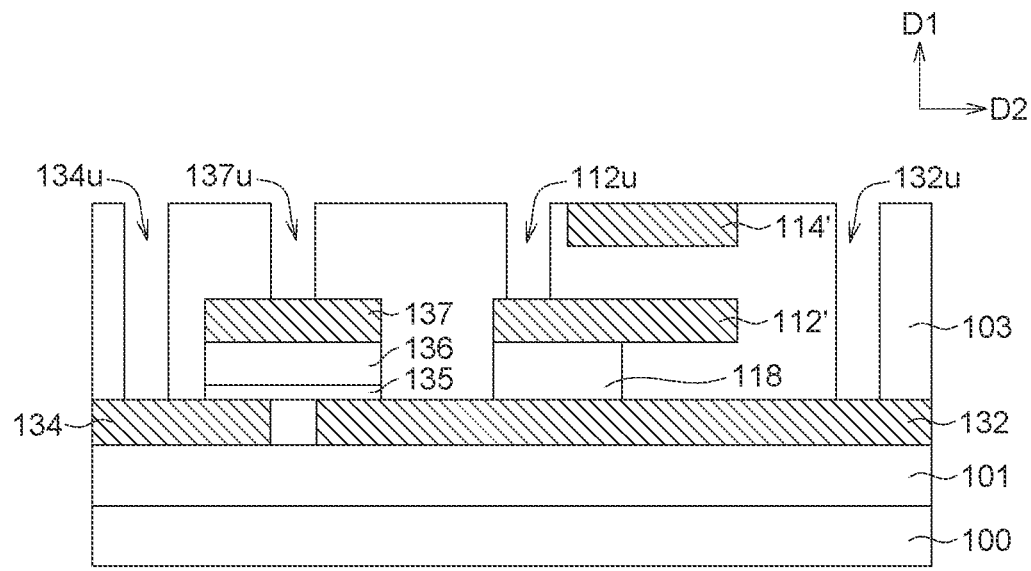

As shown in FIG. 33, a portion of the insulating material layer 103' (not shielded by the photoresist PR) is removed through an etching process (such as dry etching), and holes 137*u* and 112*u* are formed on the second gate 137 and the lower conductive material layer 112', respectively. The holes 137*u* and 112*u* extend along the first direction D1, and expose the upper surfaces of the second gate 137 and the lower conductive material layer 112', respectively. Afterwards, the photoresist PR is removed, and the holes 134*u* and 132*u* are exposed. The remaining insulating material layer 103' is formed as the insulating layer 103.

Figure 34:
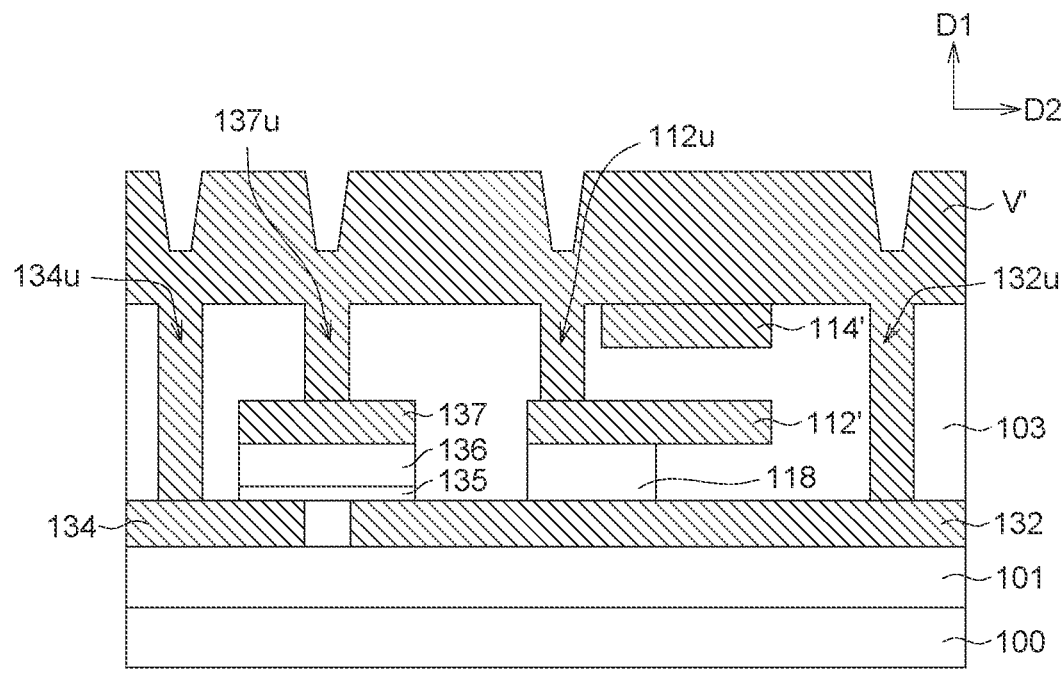

As shown in FIG. 34, a conductive material layer V' is formed in the holes 134*u*, 132*u*, 137*u* and 112*u* and on the insulating layer 103 (for example, by a deposition process).

Figure 35:
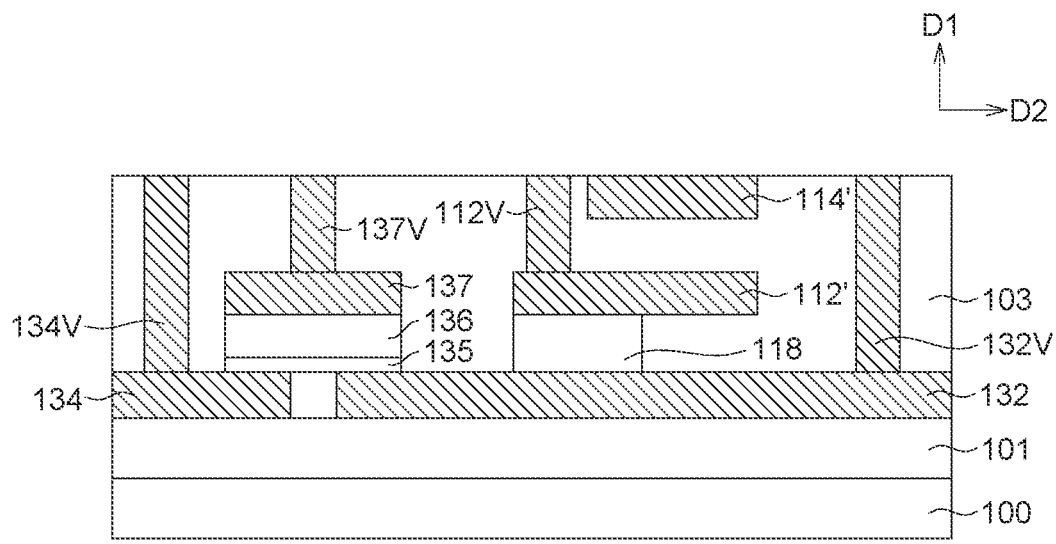

As shown in FIG. 35, a planarization process and an etch-back process are performed, so that the conductive material layers V' in the holes 134*u*, 132*u*, 137*u* and 112*u* are respectively formed as contacts 134V, 132V, 137V and 112V corresponding to the second source 134, the second drain 132, the second gate 137 and the lower conductive material layer 112'. The planarization process is, for example, chemical-mechanical polishing (CMP).

Figure 36:
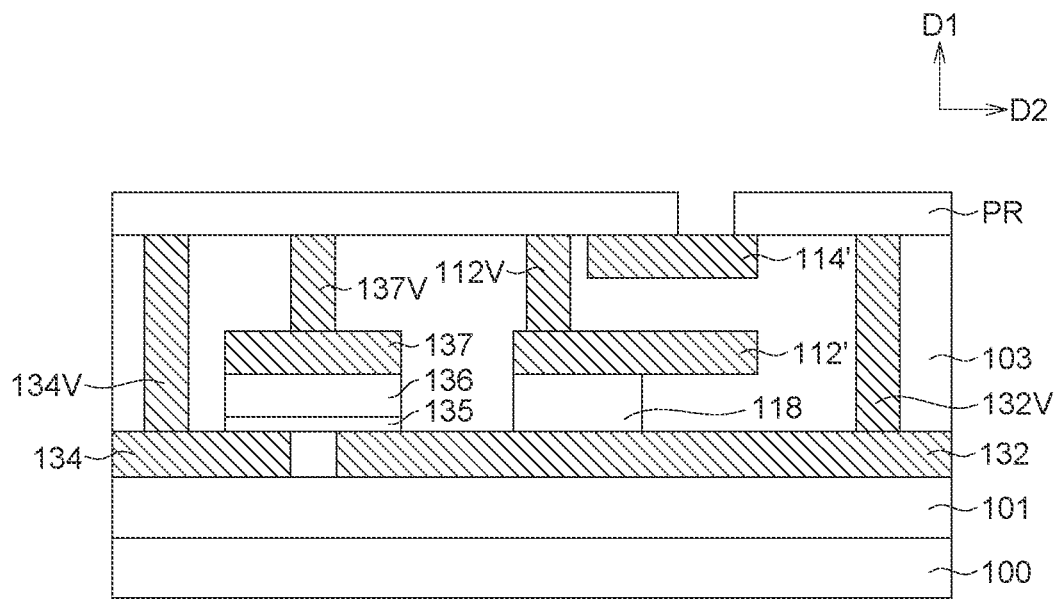

As shown in FIG. 36, a photoresist PR is formed on the structure as shown in FIG. 35, and a portion of the upper conductive material layer 114' is exposed by the photoresist PR.

Figure 37:
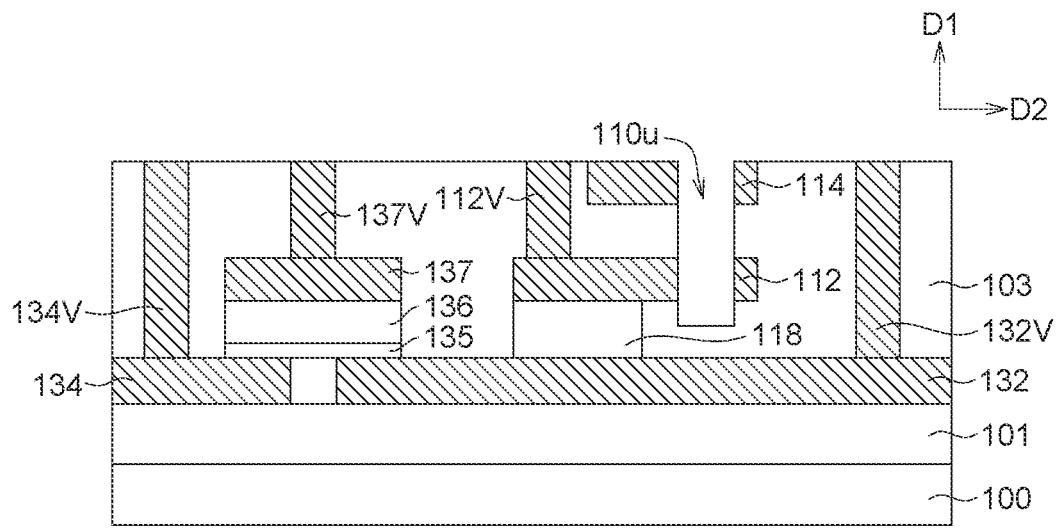

As shown in FIG. 37, portions of the upper conductive material layer 114', the insulating layer 103 and the lower conductive material layer 112' (not shielded by the photoresist PR) are removed (for example, by dry etching), to form a first opening 110*u* passing through the lower conductive material layer 112', the insulating layer 103 and the upper conductive material layer 114' along the first direction D1, and to form the first drain 112, the first dielectric layer 113 and the first source 114.

Figure 38:
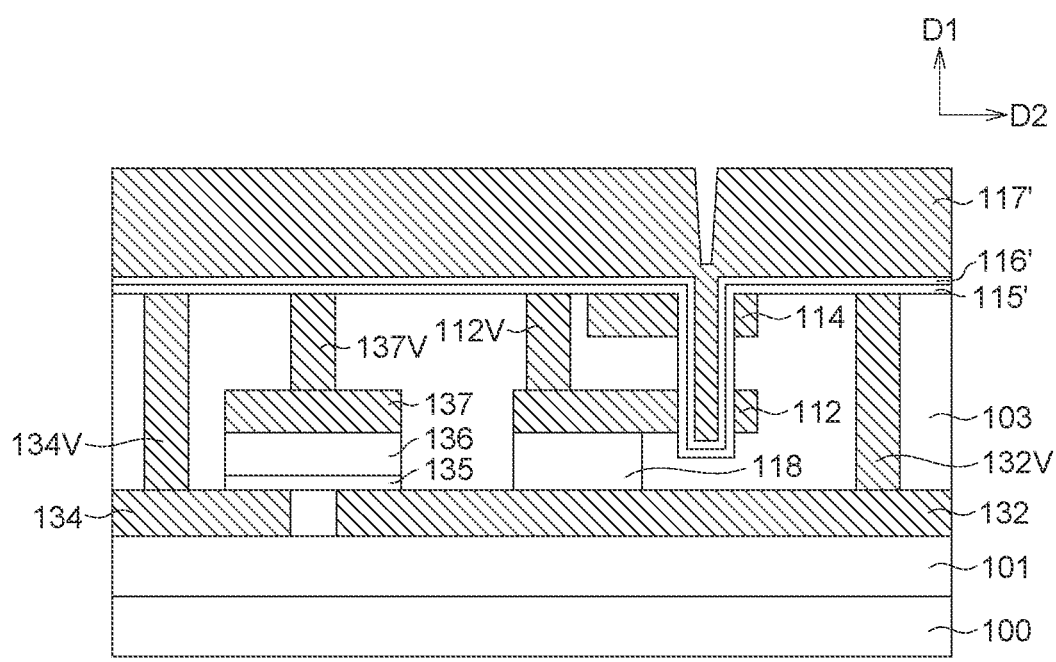

As shown in FIG. 38, a channel material layer 115' and a top dielectric material layer 116' are sequentially formed on the first source 114 and in the first opening 110*u*, and a gate material layer 117' is formed on the top dielectric material layer 116'. The channel material layer 115' and the top dielectric material layer 116' are formed by, for example, atomic layer deposition (ALD).

Figure 39:
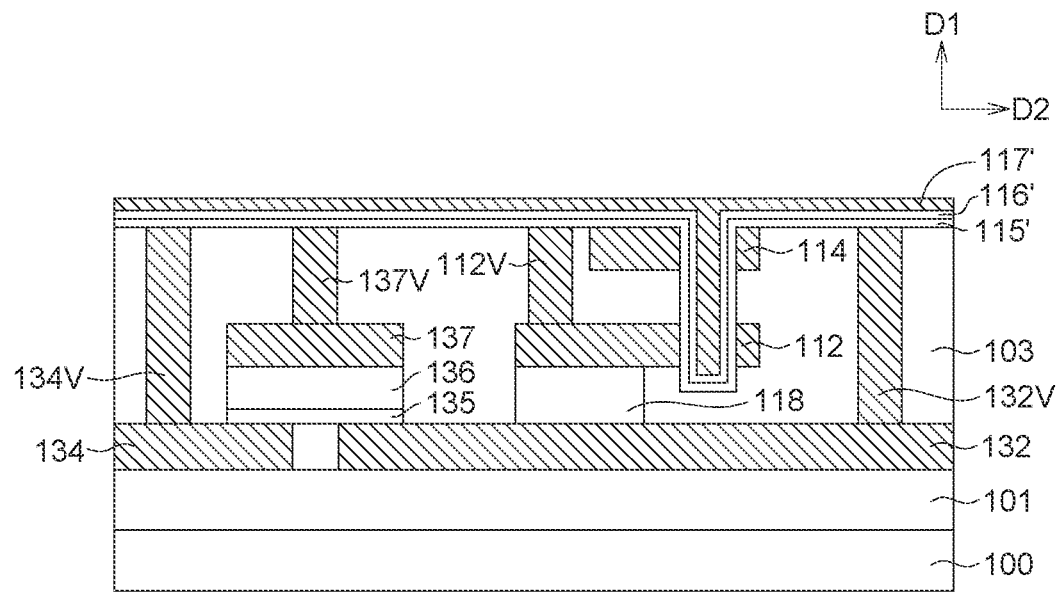

As shown in FIG. 39, a planarization process and an etch-back process are performed. The planarization process is, for example, chemical-mechanical polishing (CMP).

Figure 40:
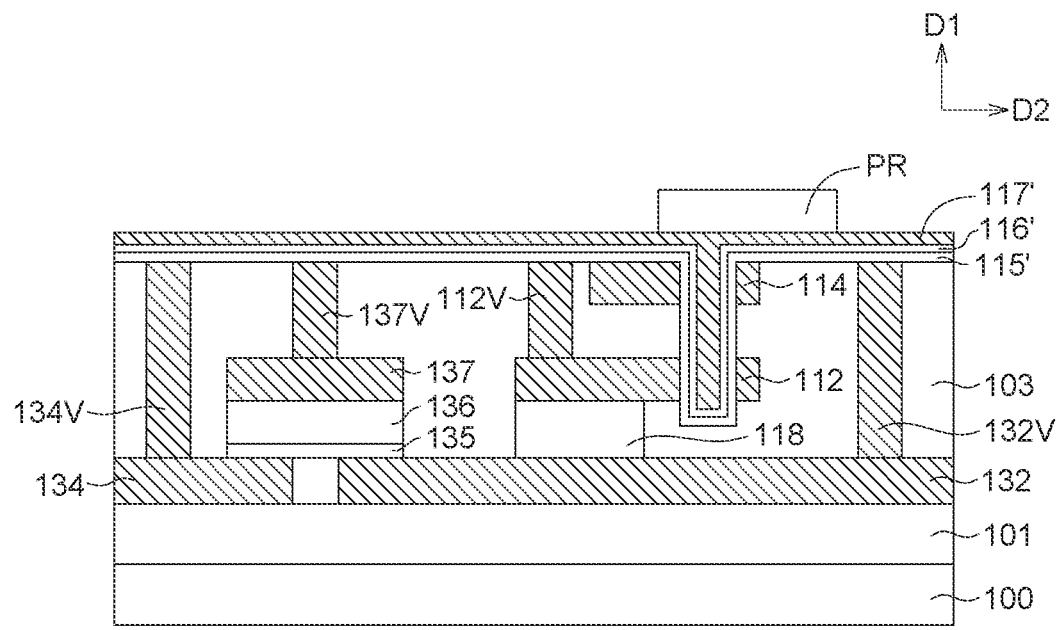

As shown in FIG. 40, a photoresist PR is formed above the first opening 110*u*.

Figure 41:
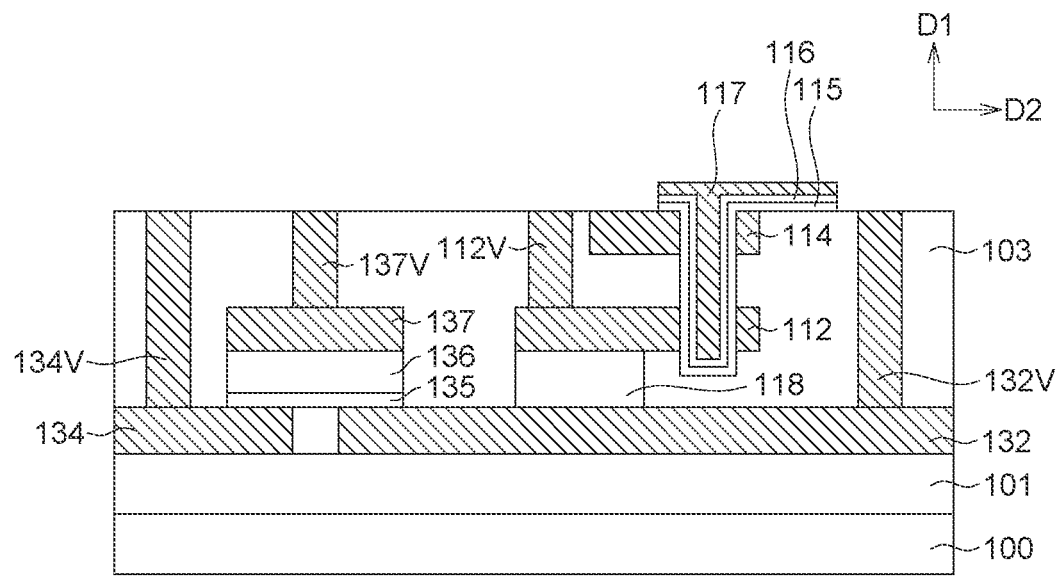

As shown in FIG. 41, portions of the channel material layer 115', the top dielectric material layer 116' and the gate material layer 117' (not shielded by the photoresist PR) are removed (for example, by dry etching), and the first channel layer 115, the first gate dielectric layer 116 and the first gate 117 are formed. The dry etching process in this step may be a selective etching, and the etchant has a higher etching rate for the channel material layer 115'. Although FIG. 41 shows that the sidewalls of the first channel layer 115, the first gate dielectric layer 116 and the first gate 117 are aligned with each other in the first direction D1, this is a simplified schematic diagram. In fact, the sidewall of the first channel layer 115 is relatively retracted, so when the conductor 132M is subsequently formed, the first channel layer 115 and the conductor 132M are electrically isolated from each other and have no contact. Among them, the retracted sidewall of the channel layer 115 can be formed by the selection of gas in the dry etching process to achieve different etching rates to the metal material constituting the first gate 117 and the oxide material constituting the first channel layer 115, thereby achieving selective etching. In addition, an acid-resistant metal can also be selected to form the first gate 117 (such as tantalum). After the dry etching process is performed to the first gate 117 (as shown in FIG. 41), a wet etching process, such as hydrofluoric acid, buffered oxide etchant (BOE), hydrochloric acid, etc., can be inserted, and the effect of shrinking the channel layer can be achieved.

Figure 42:
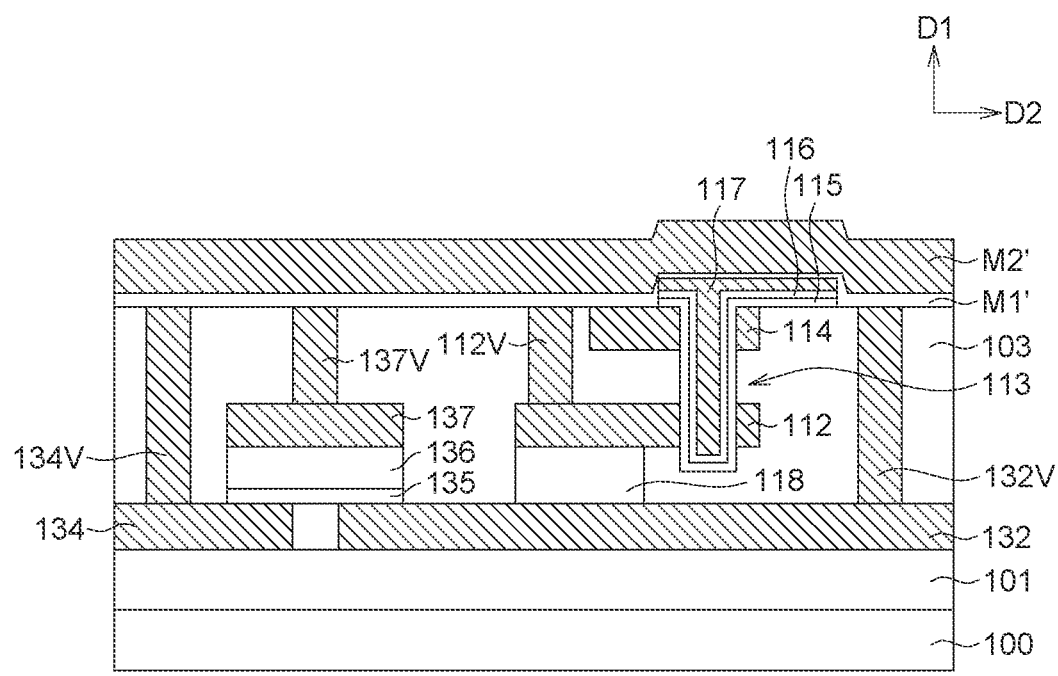

As shown in FIG. 42, a first metal material layer M1' and a second metal material layer M2' are sequentially formed on the structure as shown in FIG. 41.

Figure 43:
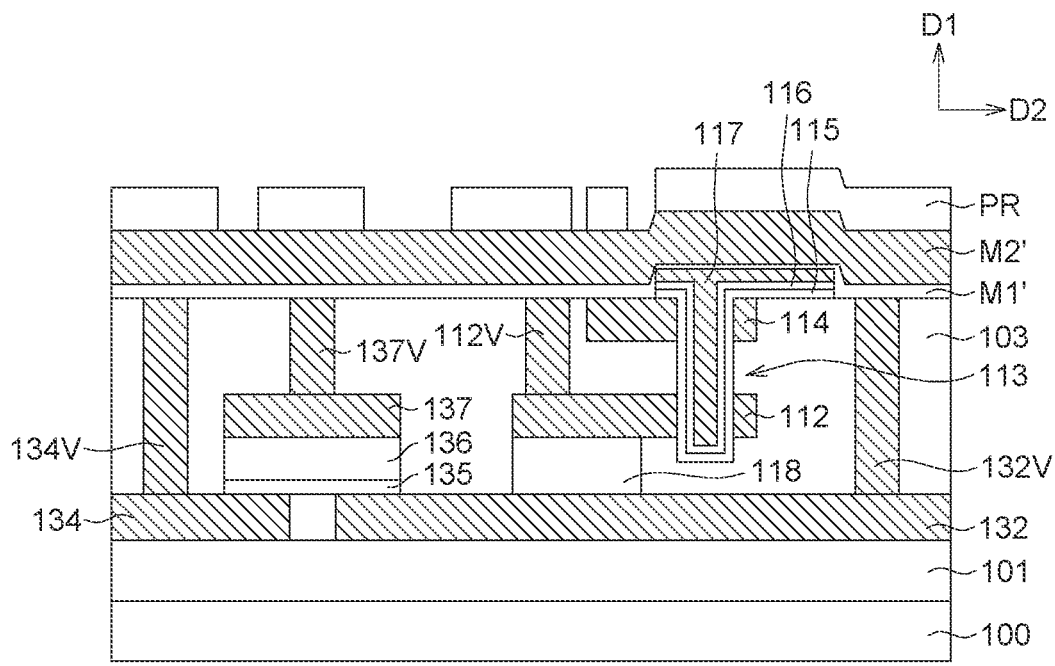

As shown in FIG. 43, a photoresist PR is formed on the structure as shown in FIG. 42.

Figure 44:
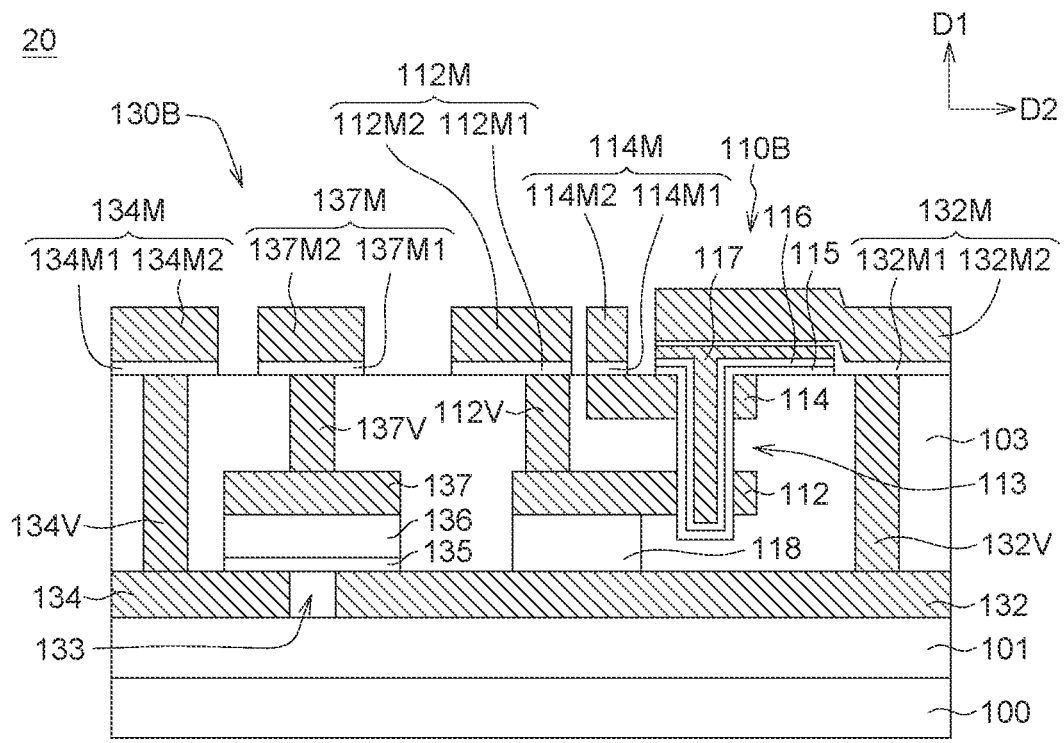

As shown in FIG. 44, portions (not shielded by the photoresist PR) of the first metal material layer M1' and the second metal material layer M2' are removed (for example, by dry etching) to respectively form conductors 134M, 137M, 112M, 114M and 132M connected to the contacts 134V, 137V, 112V, first source 114 and contact 132V. That is, the conductor 134M includes a first metal layer 134M1 and a second metal layer 134M2; the conductor 137M includes a first metal layer 137M1 and a second metal layer 137M2; the conductor 112M includes a first metal layer 112M1 and a second metal layer 112M2; the conductor 114M includes a first metal layer 114M1 and a second metal layer 114M2; the conductor 132M includes a first metal layer 132M1 and a second metal layer 132M2. In this way, an all-oxide transistor structure 20 is formed. As mentioned above, although FIG. 44 shows that the sidewalls of the first channel layer 115, the first gate dielectric layer 116 and the first gate 117 are aligned with each other in the first direction D1, this is a simplified schematic diagram. In fact, the sidewall of the first channel layer 115 is relatively retracted. Therefore, the first channel layer 115 and the conductor 132M are electrically isolated from each other and have no contact.

According to some embodiments, the insulating layer 103 can be multiple layers, and the material can be low temperature oxide (LTO) or other suitable materials. The insulating layer 103 between the first source 114 and the first drain 112 corresponds to a first dielectric layer 113, and the insulating layer 103 between the second source 134 and the second drain 132 corresponds to a second dielectric layer 133. The material of the first metal layer 137M1 (which can be used as a seed layer) may include tantalum nitride (TaN) or other suitable metal materials. The material of the second metal layer 137M2 may include aluminum copper (AlCu) or other suitable metal materials.

According to some embodiments, the pitch size of the first transistor (such as 110, 110A, 110B and 110C) and the second transistor (such as 130, 130B) of the present disclosure ranges from 1 nanometer to 10 microns.

According to an embodiment of the present disclosure, the all-oxide transistor structure includes a three-dimensional first transistor. The first channel layer in the first transistor is annular, which can provide a larger channel width. Further, the first channel layer is formed by atomic layer deposition, so it has high electron mobility. Furthermore, compared with the comparative example in which the transistor includes a silicon-based channel layer, the channel layers of the transistors of the present disclosure are all-oxide semiconductors, which mainly have the following three advantages: (1) It can be processed at low temperature (for example, less than 500 degrees Celsius); (2) it can be grown on a large area (for example, it can be applied to fourth-generation (G4) to eleventh-generation (G11) glass substrates); and (3) it can reduce the occurrence of leakage current. Therefore, the all-oxide transistor structure of the present disclosure can provide a large driving current; has excellent power efficiency; can be applied to large-area display panels, and can meet the requirements for micro-light-emitting elements.

It will be apparent to those skilled in the art that various modifications and variations can be made to the disclosed embodiments. It is intended that the specification and examples be considered as exemplars only, with a true scope of the disclosure being indicated by the following claims and their equivalents.

What is claimed is:

1. An all-oxide transistor structure, comprising:
    a substrate having an upper surface;
    a first transistor disposed on the upper surface of the substrate, wherein the first transistor comprises:
    a first drain, a first dielectric layer and a first source disposed on the substrate along a first direction, and the first direction is parallel to a normal direction of the upper surface;
    at least one first opening passing through the first drain, the first dielectric layer and the first source along the first direction; and
    a first channel layer, a first gate dielectric layer and a first gate disposed in the at least one first opening, wherein the at least one first opening is disposed on the first drain, the first dielectric layer and the first source, and the at least one first opening is a columnar opening, wherein the first channel layer of the first transistor is disposed on a hole wall of the first opening, the first gate dielectric layer is disposed on a hole wall of the first channel layer, and the first gate is disposed in an opening on the first gate dielectric layer,
    wherein a number of the at least one first opening is plural, the first openings are separated from each other, and the first channel layer, the first gate dielectric layer and the first gate are disposed in the first openings.

2. The all-oxide transistor structure according to claim 1, wherein the first drain overlaps the first source in the first direction.

3. The all-oxide transistor structure according to claim 1, wherein a portion of the first channel layer and the first gate dielectric layer overlap the first source in the first direction.

4. The all-oxide transistor structure according to claim 1, wherein the columnar opening is a cylindrical opening, an elliptical columnar opening, a rectangular columnar opening or other geometric columnar openings.

5. The all-oxide transistor structure according to claim 1, wherein the first channel layer and the first gate dielectric layer have a L-shaped cross-section, respectively.

6. The all-oxide transistor structure according to claim 1, further comprising a second transistor disposed on the upper surface of the substrate and electrically connected to the first transistor, wherein the second transistor comprises:
    a second drain and a second source disposed on the substrate;
    a second channel layer disposed between the second drain and the second source, wherein a material of the second channel layer comprises semiconducting oxide; and
    a second gate disposed on the second channel layer.

7. The all-oxide transistor structure according to claim 6, wherein the second drain of the second transistor is electrically connected to the first gate of the first transistor, the second source and the second gate of the second transistor are electrically connected to a data line and a gate line, respectively, and the second transistor is used as a switching transistor.

8. The all-oxide transistor structure according to claim 6, further comprising a capacitor formed between the first transistor and the second transistor.

9. The all-oxide transistor structure according to claim 1, wherein the first source is electrically connected to a first power supply, the first drain is electrically connected to a second power supply, a voltage of the first power supply is higher than a voltage of the second power supply, and the first transistor is used as a driving transistor.

10. A method for fabricating an all-oxide transistor structure, comprising:
    providing a substrate having an upper surface; and
    fabricating a first transistor on the upper surface of the substrate, wherein the first transistor comprises:
    a first drain, a first dielectric layer and a first source disposed on the substrate along a first direction, and the first direction is parallel to a normal direction of the upper surface;
    at least one first opening passing through the first drain, the first dielectric layer and the first source along the first direction; and
    a first channel layer, a first gate dielectric layer and a first gate deposited in the at least one first opening, wherein the first gate dielectric layer is deposited on the first channel layer, the first gate is deposited on the first gate dielectric layer, and the deposition of the first channel layer and the deposition of the first gate dielectric layer are performed by an atomic layer deposition, respectively,
    wherein a number of the at least one first opening is plural, the first openings are separated from each other, and the first channel layer, the first gate dielectric layer and the first gate are disposed in the first openings.

11. The method according to claim 10, wherein the step of fabricating the first transistor comprises:
    sequentially forming a lower conductive material layer, an insulating material layer and an upper conductive material layer on the substrate;
    removing portions of the lower conductive material layer, the insulating material layer and the upper conductive material layer, to form the at least one opening passing through the lower conductive material layer, the insulating material layer and the upper conductive material layer, and forming the first drain, the first dielectric layer and the first source;

sequentially forming a channel material layer and a top dielectric material layer on the first source and in the at least one first opening;

forming a gate material layer on the top dielectric material layer; and removing portions the channel material layer, the top dielectric material layer and the gate material layer, and forming the first channel layer, the first gate dielectric layer and the first gate.

12. The method according to claim 11, wherein the channel material layer is formed by an atomic layer deposition.

13. The method according to claim 11, wherein the top dielectric material layer is formed by an atomic layer deposition.

14. The method according to claim 11, further comprising forming a second transistor disposed on the upper surface of the substrate, wherein the second transistor is electrically connected to the first transistor, and the second transistor comprises:
- a second drain and a second source disposed on the substrate;
- a second channel layer disposed between the second drain and the second source, wherein a material of the second channel layer comprises semiconducting oxide; and
- a second gate disposed on the second channel layer.

15. The method according to claim 14, wherein the first drain and the second gate are formed by the lower conductive material layer.

16. The method according to claim 14, further comprising:
forming a contact on the second drain; and
forming a conductor on the contact and the first gate, so that the second drain is electrically connected to the first gate by the contact and the conductor.

17. The method according to claim 10, wherein the at least one first opening is formed by dry etching.

18. A display panel, comprising:
a substrate;
an array of pixels disposed on the substrate; and
a driving circuit disposed on the substrate, wherein the array of pixels and the driving circuit comprise an all-oxide transistor structure, wherein the all-oxide transistor structure comprises:
a substrate having an upper surface;
a first transistor disposed on the upper surface of the substrate, wherein the first transistor comprises:
a first drain, a first dielectric layer and a first source disposed on the substrate along a first direction, and the first direction is parallel to a normal direction of the upper surface;
at least one first opening passing through the first drain, the first dielectric layer and the first source along the first direction; and
a first channel layer, a first gate dielectric layer and a first gate disposed in the at least one first opening, wherein the at least one first opening is disposed on the first drain, the first dielectric layer and the first source, and the at least one first opening is a columnar opening, wherein the first channel layer of the first transistor is disposed on a hole wall of the first opening, the first gate dielectric layer is disposed on a hole wall of the first channel layer, and the first gate is disposed in an opening on the first gate dielectric layer,
wherein a number of the at least one first opening is plural, the first openings are separated from each other, and the first channel layer, the first gate dielectric layer and the first gate are disposed in the first openings.

* * * * *